United States Patent
Sasaki et al.

[19]

[11] Patent Number: 5,923,542
[45] Date of Patent: Jul. 13, 1999

[54] METHOD AND APPARATUS FOR DRIVING PIEZOELECTRIC TRANSFORMER

[75] Inventors: Hiroshi Sasaki; Kouichi Iguchi, both of Tokyo, Japan

[73] Assignee: NEC Corporation, Tokyo, Japan

[21] Appl. No.: 09/170,761

[22] Filed: Oct. 13, 1998

[30] Foreign Application Priority Data

Oct. 31, 1997 [JP] Japan ................................. 9-300237

[51] Int. Cl.$^6$ .......................... H02M 3/335; H01L 41/08
[52] U.S. Cl. ................................ 363/16; 363/97; 310/318
[58] Field of Search ................................ 363/15, 16, 78, 363/95, 97, 131; 323/355; 310/314, 316, 318, 319

[56] References Cited

U.S. PATENT DOCUMENTS

| | | | |
|---|---|---|---|
| 5,548,189 | 8/1996 | Williams | 315/224 |
| 5,675,484 | 10/1997 | Shimada | 363/71 |
| 5,705,877 | 1/1998 | Shimada | 310/318 |
| 5,739,679 | 4/1998 | Takehara et al. | 323/299 |
| 5,760,619 | 6/1998 | Yamaguchi | 327/110 |
| 5,768,111 | 6/1998 | Zaitsu | 363/15 |
| 5,834,907 | 11/1998 | Takehara | 315/307 |
| 5,859,489 | 1/1999 | Shimada | 310/318 |
| 5,866,969 | 2/1999 | Shimada et al. | 310/318 |

*Primary Examiner*—Adolf Deneke Berhane
*Attorney, Agent, or Firm*—Scully, Scott, Murphy & Presser

[57] ABSTRACT

A combination of two control methods are used, one of which is a method to control the boosting ratio of the piezoelectric transformer and another is a method to control the driving waveform of the piezoelectric transformer. The threshold values for switching the control methods are set with a hysteresis characteristic in order to avoid instability in the driving frequency at the time of switching and also to avoid driving at a natural frequency. When the source voltage is fixed, the driving frequency is increased by changing the resistance of the detection resistor 16 until the driving frequency reaches the natural frequency causing problems. When the driving frequency reaches the natural frequency, the power supply to the driving circuit is reduced to reduce the amplitude of the driving wave for reducing the driving frequency without changing the output voltage. At this state when the amplitude is small, the minimum output voltage is obtained by increasing the driving frequency to the natural frequency. This method and apparatus provide a wider range of output voltages and reliable output characteristics of the piezoelectric transformer.

9 Claims, 13 Drawing Sheets

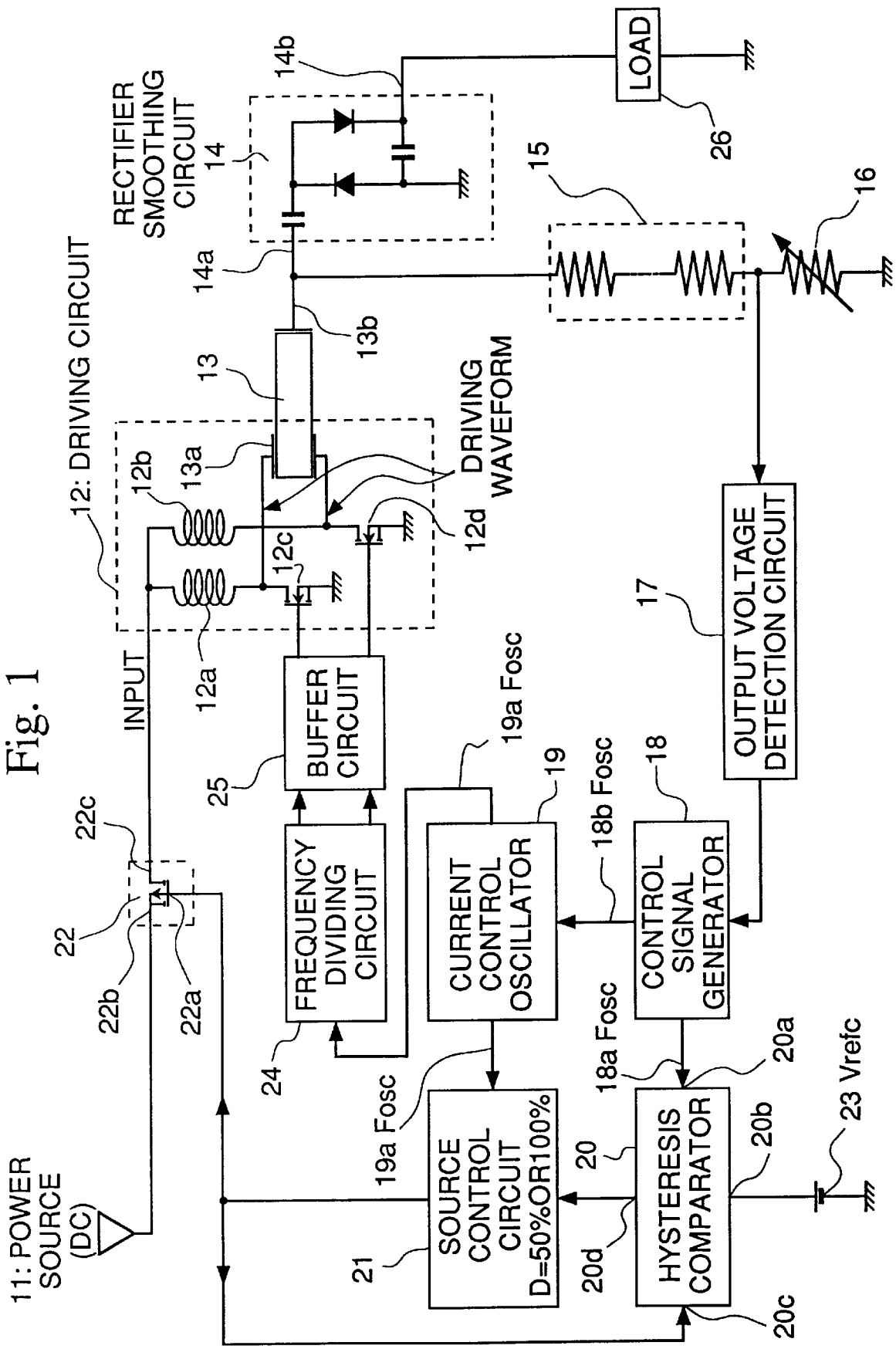

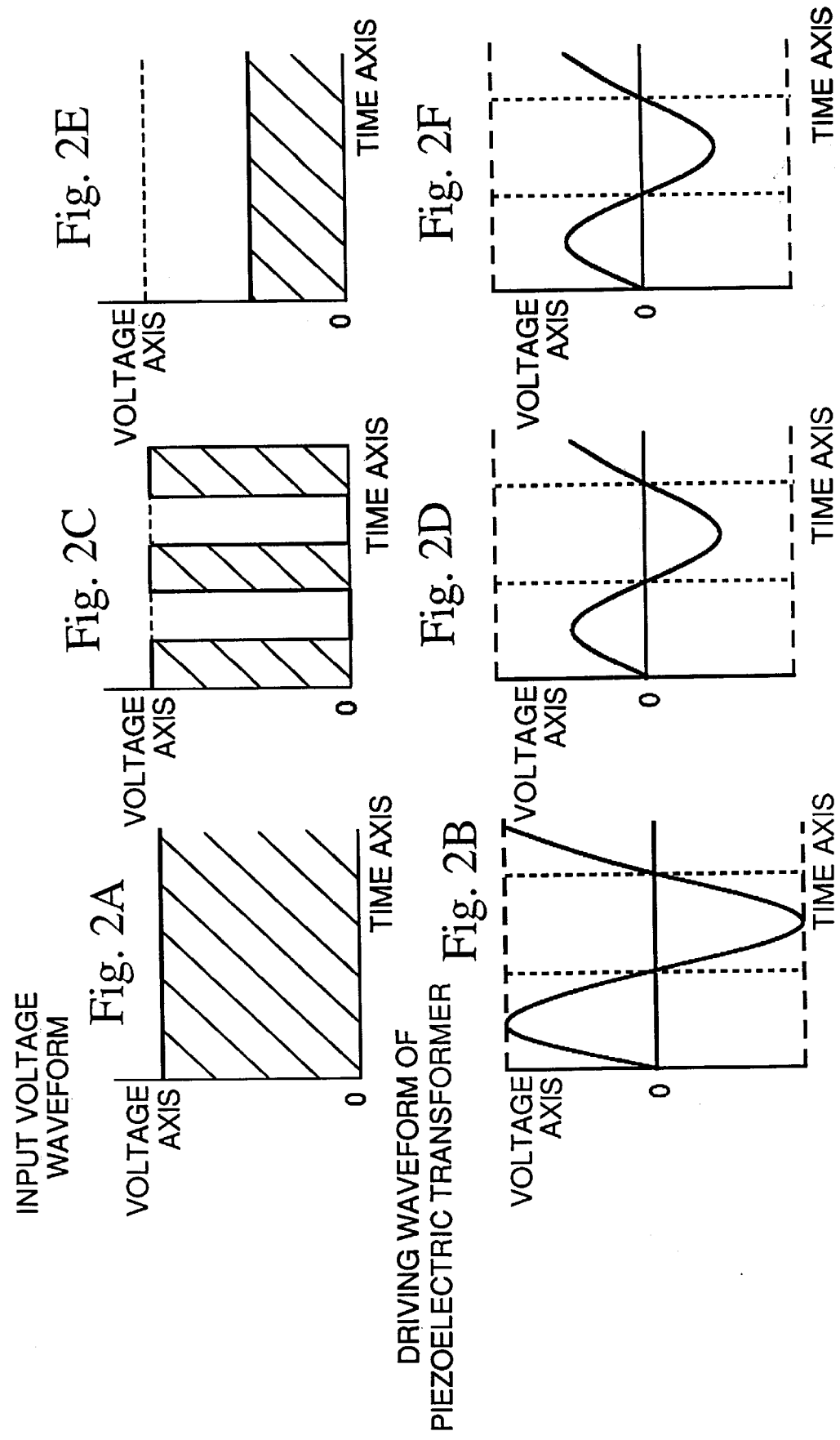

DRIVING WAVEFORM OF PIEZOELECTRIC TRANSFORMER

① NORMAL OPERATION

② FIRST PROBLEM

③ SECOND PROBLEM

④ FIRST AND SECOND PROBLEMS

METHOD AND APPARATUS FOR DRIVING PIEZOELECTRIC TRANSFORMER

BACKGROUND OF THE INVENTION

1. Field of the Invention

This invention relates to a method and apparatus for driving a piezoelectric transformer and particularly relates to the method and apparatus for driving the piezoelectric transformer as a high voltage power source for a copier and a printer utilizing an electrophotographic system.

This application is based on Patent Application No. Hei 9-300237 filed in Japan, the content of which is incorporated herein by reference.

2. Background Art

As a conventional method and apparatus for driving a piezoelectric transformer, a method and apparatus for driving a piezoelectric transformer used for an inverter power supply of a cold cathode tube is disclosed in Japanese Patent Application No. Hei 9-135573. In this inverter power supply of the cold cathode tube, a piezoelectric transformer is used as a boosting transformer for the inverter power supply for a cold cathode fluorescent lamp for use as a back-light of a liquid-crystal display. In this application, a pulse-width variation means is adopted as the method of driving the piezoelectric transformer for safe lighting of the cold cathode fluorescent lamp in response to the changes of the source voltage and the load.

FIG. 10 is a block-diagram showing a conventional driving apparatus of a piezoelectric transformer. In FIG. 10, a feedback resistor 76 with a small resistance is connected to a cold cathode fluorescent lamp 75 in series, and current which flows in the cold cathode fluorescent lamp is detected by the feedback resistor 76. The voltage applied across both ends of the feedback resistor is input into a current detection circuit 77 and a phase detection circuit 78. The current detection circuit 77 detects a load current which flows from the voltage at both ends of the feed back resistance 76 to the cold cathode fluorescent lamp 75 and the result of the detection is input into the pulse width control circuit 79.

The pulse width control circuit 79 controls a pulse width by means of a pulse width variable circuit 80, so as to stabilize the voltage at both ends of the resistance at a constant value, that is , so as to stabilize the load current flowing in the cold cathode fluorescent lamp at a constant value. A pulse signal output from the pulse width variable circuit 80 is taken by a waveform shaping circuit 72 at an amplitude corresponding to the pulse width, which is converted into a driving signal by the drive circuit 73 and which is supplied to the piezoelectric transformer 74 to drive thereof. The piezoelectric transformer boosts the signal and the boosted signal is supplied to the cold cathode fluorescent lamp.

Here, if, for example, a current flowing in the cold cathode fluorescent lamp 75, which corresponds to a load, becomes small, the voltage at both ends of the feedback resistor becomes small so that the pulse width control circuit 79 detects that the voltage at both ends of the feedback resistor is lower than a predetermined value. An instruction is then transmitted to the pulse width variable circuit 80 so as to expand the pulse width, and the waveform shaping circuits 72 expands the amplitude of the output signal. Thereby, the input to the piezoelectric transformer 74 is increased, and the current flowing in the cold cathode fluorescent lamp is also increased.

In contrast, when the current of the cold cathode fluorescent lamp becomes large, the voltage at both ends of the feedback resistor 76 increases. The pulse-width control circuit 79 detects that the voltage at both ends of the feedback resistor 76 is higher than a predetermined value and transmits an instruction to the pulse-width control circuit 72, and an amplitude of the output signal of the waveform shaping circuit 72 is reduced. Thereby, the input of the piezoelectric transformer 74 is reduced and the electric current flowing in the cold cathode fluorescent lamp is reduced.

The above control system enables the stabilization of the current in the cold cathode fluorescent lamp at a constant value so that the lamp is lighted at a constant brightness. In addition, the phase detection circuit 78 sets a limitation in the relationship between the resonance frequency and the driving frequency.

However, when the impedance of the cold cathode fluorescent lamp becomes extremely low, this conventional driving apparatus must reduce an output voltage of the piezoelectric transformer. When the output voltage is reduced, the ratio of higher harmonic wave components in the driving signal becomes quite high, so that the loss in the piezoelectric transformer 74 becomes high, the driving efficiency of the piezoelectric transformer 74 becomes low, and the reliability also becomes low.

FIG. 11 is a block-diagram showing an example of a conventional piezoelectric transformer which is improved so as to solve the above problems. In the figure, the same constituting elements as those in FIG. 10 are represented by the same reference numerals and the explanations of those elements are omitted. In FIG. 11, when the impedance of the cold cathode fluorescent lamp 75 becomes extremely low, the output current is too high even though the driving voltage is constant; so that the pulse width control circuits 81 outputs an instruction to the pulse width variable circuit 80 so as to reduce the pulse width of the output signal, and at the same time, an instruction is outputted to the DC-DC converter 82. The DC-DC converter 82, after receiving a detected voltage of the source voltage from a source voltage detection circuit 83, reduces the output current voltage of the DC-DC converter 82 based on the instruction. The reduced current voltage is supplied to the driving circuit as the DC source. This causes the restoration of the pulse width of the driving signal supplied to the piezoelectric transformer 74 from the driving circuit 84 into a normal width.

In contrast, when the impedance of the cold cathode fluorescent lamp 75 becomes quite high, a sufficient output current may not be taken out, even if the pulse width of the driving voltage of the piezoelectric transformer 74 is expanded. In this case, the pulse width control circuit 81 supplies an instruction so as to expand the pulse width, and at the same time, an instruction to raise the output current voltage is supplied to the DC-DC converter 82. The thus raised current voltage is supplied to the driving circuit 84 as the DC source for controlling the pulse width of the output driving current at the expanded state. Thus, the conventional circuit is designed such that conversion of the DC voltage is executed by DC-DC converter 82 only when the pulse width of the driving signal is outside of a predetermined range.

However, the variable control of the pulse width of the driving signal by the conventional apparatus may possibly lose a fixed relationship between the driving frequency and the resonance frequency of the piezoelectric transformer. When the driving frequency is far away from the resonance frequency of the piezoelectric transformer 74, the driving efficiency of the piezoelectric transformer 74 may be remarkably reduced or only a variable control of the pulse width may not allow for sufficient current to flow in the cold cathode fluorescent lamp 75 as a load.

FIG. 12 shows a block-diagram of an example of a conventional driving apparatus of the piezoelectric transformer which was constructed to overcome the above problem. In the figure, the same constituting elements as those in FIGS. 8 and 9 are represented by the same reference numerals and explanations of those elements are omitted. In the conventional driving apparatus shown as a block diagram in FIG. 12, the driving frequency is rendered variable within a limited range by setting a limit in the relationship between the resonance frequency and the driving frequency of the piezoelectric transformer 74 by the phase detection circuit 78; and also by setting a limitation in the relationship between the resonance frequency and the driving frequency of the piezoelectric transformer 74 by inputting the output of the current detection circuit 85 into the variable oscillation circuit 86.

Accordingly, when the output current becomes low even if the phase difference is within a specified range, the above construction permits the pulse width control circuit 79 to supply an instruction to the pulse width variable circuit 80 so as to expand the pulse width of the driving signal to enlarge the amplitude of the output signal of the waveform shaping circuit 72. Furthermore, if the output current is still smaller than a prescribed value even though the pulse width ofthe.pulse signal is reduced, the output current is increased by reducing the driving frequency within a prescribed frequency range corresponding to a prescribed range of the phase difference.

Conversely, if the load current is too large, the pulse width control circuits 79 may supply an instruction to the pulse width variable circuit 80 so as to reduce the pulse width of the driving signal to reduce the amplitude of the output signal of the waveform shaping circuit 72. In addition, if the output current is still larger than the specified value even though the pulse width of the driving signal is reduced, the output current is further reduced by increasing the driving frequency within a driving frequency range corresponding to the set range of the phase difference.

A conventional art as to setting a hysteresis character is disclosed, for example, in Japanese Patent Application, First Publication Hei 5-183524. In the above application, two different values are used, that is, a hysteresis is given, as reference values for comparing two output voltages at the time of switching a step-attenuator of an IF band signal of a signal receiving apparatus using an optical transmission system. Another example is disclosed in Japanese Patent Application, First Publication No. Hei 3-241920, in which two different values are provided, or a hysteresis character is given for changing output voltages of an standard voltage source for different input voltages to a reset circuit. Moreover, Japanese Patent Application, First Publication No. Hei 1-235414 discloses to set two different values, that is, to give a hysteresis between an operating point at which the MOS-type field effect transistor (MOS FET) is switched from on to off, and an operating point at which MOS FET is switched from off to on.

Whereas, the conventional method and apparatus for driving the piezoelectric transformer has a problem that the output voltage does not have a wide variable range. The reason for this is because the output voltage is varied by changing the boosting ratio of the piezoelectric transformer 74 by changing the driving frequency of the piezoelectric transformer 74.

Since it is preferable to drive the piezoelectric transformer at high efficiency by use of a sine wave which does not include any unnecessary frequency component, the driving waveform is adjusted so as to be shaped in a sine wave utilizing a voltage resonance. The driving circuit 73 utilizes a voltage resonance by an inductance and a capacitance, and half sine waves are produced and a sine wave is produced by combining two half waves by executing the optimum E class operation at the zero voltage switching at the time of turning the switch on. A coil or an electromagnetic transformer are used for the inductance, and an equivalent input capacity of the piezolelectric transformer is used for the capacitance.

The driving waveform of the thus constructed driving apparatus is tend to change by the driving frequency, and it is hard to obtain a sine wave, when the driving frequency is out of the frequency used for the circuit adjustment and the efficiency of the piezolelectric transformer decreases. Particularly, when a higher frequency than that used for the circuit adjustment is used, the driving waveform is changed and the efficiency is reduced. The driving frequency from which the efficiency begin to decrease is a natural frequency determined by the vibration mode, the element structure, the element size, and the driving circuit system of the piezoelectric transformer.

When the driving frequency reaches the natural frequency which is higher than the frequency used for the circuit adjustment, the driving waveform is broken due to the collapse of the voltage resonance to form the half sine wave lacking the latter half. If the driving frequency is higher than the natural frequency, the waveform becomes a separated sector form since the break of the half sine wave extends further. Although the driving apparatus is maintained at high efficiency by zero voltage switching, if the driving waveform becomes the sector form, the switching is rendered to the non-zero switching and the driving circuit is heated. Since the potential of non-zero switching is proportional to the degree of breakage, so that the larger the breakage, the higher the heating. The heat generation of the piezoelectric transformer and the driving apparatus reduces the efficiency of the power supply and finally the operation is deteriorated, so that the upper limit to be able to shift the driving frequency is the natural value. It is necessary for the high voltage power supply to provide a wide frequency range to be able to move the frequency range for obtaining a wide output voltage range. However, the upper limit of the driving frequency is limited by the natural frequency, so that a wide variable frequency range is not obtainable.

A conventional method and apparatus for driving piezoelectric transformers is disclosed in Japanese Patent Application, First Publication No. Hei 9-135573, which is used for fixing the load current flowing in a cold cathode fluorescent lamp irrespective of the ambient circumstances. The above disclosed method first detects a difference in phases between the input and output power by a phase difference detection circuit 78, and while variably controlling the pulse width, the method restricts the fluctuating frequency width of the driving frequency by the phase difference. However, the above method is not effective when the natural frequency is included within a frequency width restricted by the phase difference.

The second problem is that driving waveform distortion is generated when the upper limit of the voltage of the power supply is expanded and causes a problem in reliability. The reason for this is that, when the amplitude of the driving waveform increases by the increase of the voltage of the power supply, the driving frequency shifts to higher frequency than the resonance frequency for maintaining a fixed output power.

The driving waveform is, utilizing a voltage resonance of the inductance and the capacitance, produced by combining two half sine waves formed by executing the optimum E class operation which corresponds to a zero voltage switching when the switch is turned on. A coil or an electromagnetic transformer is used as the inductance, and an equivalent input capacity of the piezoelectric transformer is used as the capacitance. Thus, when the voltage of the power supply increases, then the input voltage to the driving circuit is increased.

The amplitude of the half sine wave produced by the voltage resonance increases in proportion to the input voltage, and, therewith, the amplitude of the sine wave which corresponds to the driving waveform increases. When the amplitude of the driving waveform increases, a control to reduce the boosting ratio of the piezoelectric transformer for maintaining the output power at a fixed value begins. The boosting ratio of the piezoelectric transformer has a characteristic which forms a convex curve against the driving frequency with a peak at the resonance frequency. Therefore, since the boosting ratio is reduced when the driving frequency is made higher than the resonance frequency, a control starts to drive at higher frequency than the resonance frequency for maintaining a constant output power if the amplitude of the driving waveform increases.

However, if the piezoelectric transformer is driven at higher frequency than the resonance frequency, distortion of the driving waveform is generated by superimposing higher harmonic waves of the driving frequency on the natural frequency which is determined by the vibration mode, the element structure, the element size, and the driving circuit construction of the piezoelectric transformer. When the upper limit of the source voltage is extended wider, the driving frequency is made to use a higher frequency range so that there is a higher possibility for the driving frequency to be operated at the natural frequency.

Moreover, if an unnecessary frequency component is included in the driving waveform of the piezoelectric transformer, the element will be subjected to unnecessary vibration, which results in deterioration of the reliability.

A conventional method and apparatus for driving the piezoelectric transformer disclosed in Japanese Patent Application, First Publication No. Hei 9-135573 controls the load current flowing in a cold cathode fluorescent lamp as a load at a fixed level irrespective of the ambient circumstances. The above mentioned conventional method first detects the phase difference between the input and output powers by a phase difference detection circuit 78 and, while maintaining the pulse width of the driving signal variable, restricts the fluctuating frequency width of the driving frequency by the phase difference. However, the above method is not effective when the natural value is included within a frequency width restricted by the phase difference.

It is therefore the object of the present invention to provide a method and apparatus for driving a piezoelectric transformer for a high voltage power supply so as to be capable of expanding a variable range of the outputting voltage.

Another object of the present invention is to provide a method and apparatus for driving a piezoelectric transformer so as to be capable of maintaining the reliability in the wide range of the source voltage.

SUMMARY OF THE INVENTION

In order to solve the above problems, the present method of driving the piezoelectric transformer comprises the steps of:

controlling the piezoelectric transformer by switching an amplitude of the driving waveform into a small amplitude and driving said piezoelectric transformer at a driving frequency less than a natural frequency, when the driving frequency reaches the proper driving frequency at which the driving waveform becomes a non-zero voltage switching state or becomes a waveform superimposed with higher harmonic wave, while the driving waveform is increased within a frequency range which is higher than the resonance frequency;

controlling the piezoelectric transformer by switching the amplitude of the driving waveform into a large amplitude and driving the piezoelectric transformer at a driving frequency higher than the proper driving frequency when the driving frequency reaches a predetermined frequency near the resonance frequency, while driving the piezoelectric transformer at the small amplitude and driving the piezoelectric transformer at higher frequency than the resonance frequency;

wherein, when the source voltage is fixed, the output voltage at the time of switching the amplitude of the driving wave into the small amplitude is lower than the output voltage at the time of switching the amplitude of the waveform into the large amplitude.

Another driving method of a piezoelectric transformer according to the present invention comprising steps of:

controlling the piezoelectric transformer by switching an amplitude of the driving waveform into a small amplitude and driving said piezoelectric transformer at a driving frequency less than a natural frequency, when the driving frequency reaches the proper driving frequency at which the driving waveform becomes a non-zero voltage switching state or becomes a waveform superimposed with higher harmonic wave, while the driving waveform is increased within a frequency range which is higher than the resonance frequency;

controlling the piezoelectric transformer by switching the amplitude of the driving waveform into a large amplitude and driving the piezoelectric transformer at a driving frequency higher than the proper driving frequency when the driving frequency reaches a predetermined frequency near the resonance frequency, while driving the piezoelectric transformer at the small amplitude and driving the piezoelectric transformer at higher frequency than the resonance frequency;

wherein, when the output voltage is fixed, the source voltage at the time of switching the amplitude of the driving wave into the small amplitude is higher than the source voltage at the time of switching the amplitude of the waveform into the large amplitude.

In order to achieve the above objective, a driving apparatus of a piezoelectric transformer which constitutes a boosting-type voltage resonance circuit including an input portion for driving a piezoelectric transformer, comprises:

a driving circuit for applying the driving waveform similar to a sine wave to the input portion of the piezoelectric transformer;

a switching element connected with both input terminals of the piezoelectric transformer and a DC power source;

a rectifying smoothing circuit for rectifying and smoothing the output signal from the piezoelectric transformer and for applying thereof to the load;

a fixed impedance circuit, one end of which is connected to the output terminal of the piezoelectric transformer;

a detection resistor connected to the other end of the fixed impedance circuit;

an output voltage detection circuit for detecting voltage at both ends of the detection resistor;

a control signal generator for generating a control voltage and a control current in response to the detected voltage detected by the output voltage detection circuit;

a current control oscillator which oscillates at a frequency corresponding to the control current;

a drive control signal generating means for receiving an oscillating signal, for generating a drive control waveform to supply to the driving circuit, and for generating a driving waveform;

a control circuit for generating a signal for controlling a switching element at an duty ratio of the signal generated by receiving the oscillating signal from the current control signal;

a hysteresis comparison means for comparing a standard voltage which is converted from the natural frequency at which the driving waveform turns into a zero voltage switching waveform or turns into a waveform superimposed with higher harmonic waves with the output signal of said control circuit, and for converting a duty-ratio of the output signal of the control circuit into a predetermined value of 100% or less than 100% based on the result of the comparison.

Furthermore, in order to achieve the above objective, the present invention further provides an apparatus, comprising:

a driving circuit for applying a driving waveform approximating a sine wave to the input portion of the piezoelectric transformer;

a switching element connected with both an input terminal of the piezoelectric transformer and the DC power source;

a rectifying smoothing circuit for rectifying and smoothing the output signal from the piezoelectric transformer and for application thereof to the load;

a fixed impedance circuit, one end of which is connected to the output terminal of the piezoelectric transformer;

a detection resistor connected to the other end of the fixed impedance circuit;

a output voltage detection circuit for detecting voltage at both ends of the detection resistor;

a control signal generator for generating a control voltage and a control current in response to the detected voltage detected by the output voltage detection circuit;

a temperature detecting element physically attached to said switching transistors in the driving circuit;

a current control oscillator which oscillates at a frequency corresponding to the control current;

a drive control signal generating means for receiving an oscillating signal, for generating a drive control waveform to supply to the driving circuit, and for generating a driving waveform;

a control circuit for generating a signal for controlling a switching element at a duty ratio of the signal generated by receiving the oscillating signal from the current control signal;

a control voltage from the control signal generator;

a standard voltage obtained by the voltage conversion of the proper driving frequency which corresponds to a waveform by subjecting the driving waveform to non-zero voltage switching or by superimposing with higher harmonic waves;

a hysteresis comparison means for comparing a standard voltage which is converted from the natural frequency at which the driving waveform turns into a zero voltage switching waveform or turns into a waveform superimposed with higher harmonic waves with the output signal of said control circuit, and for converting a duty-ratio of the output signal of the control circuit into a predetermined value of 100% or less than 100% based on the result of the comparison.

In the above construction, the driving waveform is shaped into a wave the same as a sine wave utilizing a voltage resonance, in order to form a sine wave without containing unnecessary frequency components. Accordingly, the driving circuit is constructed as a boosting type voltage resonance circuit, which generates a sine wave, utilizing the voltage resonance of the inductance and the capacitance, by combining two half sine waves formed by conducting the optimum E class operation which corresponds to a zero switching when the switch is turned on. A coil or an electromagnetic transformer is used as the inductance, and an equivalent input capacity of the piezoelectric transformer is used as the capacitance.

The driving waveform of the thus constructed driving circuit suffers a collapse of the voltage resonance, when the driving frequency reaches a first natural frequency which is determined by the oscillation mode, the element structure, the element size, and driving circuit construction of the piezoelectric transformer. As a result, the half sine wave lose its latter half (non-zero voltage switching) and the driving circuit generates heat. When the driving frequency reaches a second natural frequency which is determined by the oscillation mode, the element structure, the element size, and the driving circuit construction, distortion of the driving frequency and the unnecessary vibration of the element are generated by superimposing the higher harmonic component of the driving frequency, which results in deterioration of the reliability of the driving circuit. The first and the second proper frequencies are present in the higher frequency region than the resonance frequency. When the driving circuit is operated at reduced output voltage or at higher source voltage, the driving circuit will be driven in the higher frequency region, so that the driving frequency may possibly agree with the natural frequency.

In order to avoid the above agreement, the present invention maintains the output voltage corresponding to the natural frequency at a driving frequency lower than the natural frequency, when the driving frequency reaches the natural frequency so as to drive the piezoelectric transformer at a higher boosting ratio than the original boosting ratio by reducing the amplitude of the driving waveform. However, only the reduction of the amplitude of the driving waveform may cause reduction in the output voltage range, it is necessary to extend the output voltage range to conduct reciprocating control operations before and after the detection of the natural frequencies or heat-generation.

The driving frequency is effective as a parameter for switching the control before and after the detection to detect the hereinabove described first and second proper frequencies. The amplitude of the driving waveform when the driving frequency is lower than the natural frequency, any output voltage may be obtained along with an amplitude obtained by an input from the DC power source. Whereas, when the detected value reaches the natural frequency, the amplitude of the driving waveform becomes smaller than that obtained by the DC power source, since a switching element connected to the DC power source reduces the electric power supplied to the driving circuit by conducting the switching operation at a fixed duty-ratio. Thus, the driving frequency is reduced less than the natural frequency, since the piezoelectric transformer requires a higher boosting ratio than the original boosting ratio for obtaining a fixed output.

The present invention provides a broad range of output voltages and the source voltage by applying not only the first control method which changes the boosting ratio of the piezoelectric transformer by controlling the driving frequency, but also the second control method for adjusting the amplitude of the driving waveform by the use of a switching element connected to the DC power source for optionally switching between a non-control condition (control at the duty-ratio of 100%) in which the element is always turned on with reference to the natural frequency as a threshold value and a pulse width control condition to execute the on/off switching (control at a fixed duty-ratio of less than 100%).

Here, the instability of the driving frequency at the time of switching the switching element can be solved by setting a first threshold frequency at the time of switching from the pulse width control condition to the non-control condition at lower frequency than a second threshold frequency at the time of switching from the non-control condition to the pulse width control condition. That is, when the source voltage is fixed, the output voltage at the time of switching from the pulse width control to the non-control condition is higher than that of the switching from non-control condition to the pulse width control. When the output voltage is fixed, a hysteresis is given to be able to switch from the pulse width control to the non-control condition at lower voltage than that for switching from the non-control condition to the pulse width control. It is advantageous to perform the control of switching at a fixed duty-ratio, since initial instability due to the load may be solved by a simple circuit formation, and the hysteresis of the threshold values can be easily realized.

Another parameter for switching before and after detection is heat generation in the driving circuit, and the heat generation is effective when the first natural frequency is lower than the second natural frequency. In another embodiment of the present invention, the heat generation is used for the control of the amplitude. That is, the generated heat detected by a temperature detecting element such as a thermistor is converted into a voltage for use as a parameter. While the temperature is below a threshold temperature, the amplitude of the driving waveform is set as an amplitude obtained by inputting the DC power source into the driving circuit; and when the threshold temperature is reached, the switching element connected to the DC power source conducts a switching control at fixed duty-ratios to reduce the power supplied to the driving circuit, so that the amplitude of the driving waveform is lower than that obtained by the DC power source.

Accordingly, the piezoelectric transformer requires a higher boosting ratio than the original boosting ratio, so that the driving frequency becomes lower than the first natural frequency, and the driving waveform recovers in the zero voltage switching to prevent heat generation. It is possible to adjust the amplitude of the driving waveform and to obtain a wide range of output voltage and a wide range of source voltage by the use of a switching element connected to the DC power source, since the switching element switches, using the natural value as a threshold value, between the non-control condition in which the switch is regularly turned on and the pulse width control condition in which the switch is switched on and off conditions.

Here, it is possible to eliminate instability in the driving frequency at the time of switching, if the first threshold frequency in switching the control method from the non-control condition (control at the fixed duty-ratio of 100%) to the pulse width control condition (control at the fixed duty ratio of less than 100%) is lower than the second threshold frequency in switching the control method from the pulse width control to the non-control condition. As stated, when the source voltage is fixed, the output voltage at the time of switching from the pulse width control to the con-control condition is higher than that of the switching from non-control condition to the pulse width control. When the output voltage is fixed, a hysteresis is given to be able to switch from the pulse width control to the non-control condition at lower source voltage than that for switching from the non-control condition to the pulse width control. It is advantageous to execute the switching at a fixed duty-ratio, since the initial instability due to the load may be solved by a simple circuit formation, and to set the hysteresis for threshold values.

BRIEF DESCRIPTION OF DRAWINGS

FIG. 1 shows a schematic circuit diagram of the first embodiment of the present invention.

FIG. 2A to 2F show examples of the input and output voltage waveforms of the driving circuits of the present invention.

DESCRIPTION OF PREFERRED EMBODIMENTS

Figure 3A:
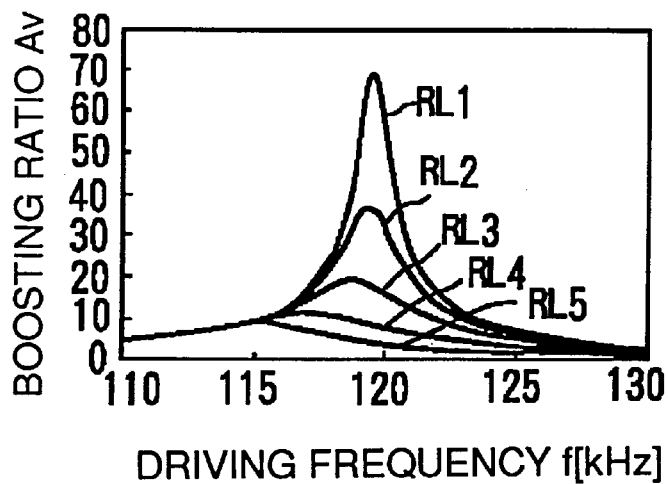
FIG. 3A, 3B, 3C are diagrams to explain problems of the conventional method and measures taken by the present invention.

Hereinafter, respective embodiments of the present invention will be described. FIG. 1 illustrates a schematic circuit diagram of the piezoelectric transformer according to the first embodiment of the present invention. In the figure, a control terminal 22a of a switching element 22 is connected to an output terminal of the power source control circuit 21, and the other two ends 22b and 22c of the switching element 22 are connected to a DC power source 11 and a driving circuit 12, respectively. When a field effect transistor (FET) is used as the switching element, the above control terminal 22a is the gate, and the other two ends are source and drain, respectively.

The driving circuit 12 comprises coils 12a and 12b, switching transistors 12c and 12d, and a input portion 13a of the piezoelectric transformer 13; and an input portion of the driving circuit 12 is grounded through serial connections with coil 12a and a switching transistor 12d and another portion is grounded through serial connections with coil 12a and a switching transistor 12c. A connection of the coil 12a with the switching transistor 12c and a connection of the coil 12b with the switching transistor 12d are connected with the input portion 13a of the piezoelectric transformer 13, respectively.

The input portion of the piezoelectric transformer 13 is included in the driving circuit 12, and the output portion 13b of the piezoelectric transformer 13 is commonly connected to a connection of the input terminal 14a of the rectifier smoothing circuit 14 with a connection of a fixed impedance circuit 14. The output terminal 14b of the rectifier smoothing circuit 14 is connected to a load 26. Further, the other end of the fixed impedance circuit 15 is grounded through the detection resistor 16, and connected to the control signal generator 18 through the output voltage detection circuit 17. The control signal generator 18 is connected to a current control oscillator 19 and a first input terminal 20a of a hysteresis comparator 20.

The second input terminal 20b of the hysteresis comparator 20 is connected to the standard voltage source 23 for application of the standard voltage Vrefc, and the third input terminal 20c of the hysteresis comparator 20 is connected to the output terminal of the source control circuit 21. The current control oscillator 19 is connected to the other input end of the source control circuit 21 as well as to a frequency divider circuit 24 and the source control circuit 21. The output end of the frequency divider circuit 24 is connected to control terminals of the switching transistor 12c and 12d in the driving circuit 12 through a buffer circuit 25.

The operation of this embodiment is described hereinafter.

When the switching element 22 is turned on, the DC voltage from the DC power source is applied to the input portion 13a of the piezoelectric transformer 13, after conversion into the AC voltage through the switching element 22 and the driving circuit 12. After being boosted, the AC voltage is supplied to the load 26 after being subjected to rectifier smoothing by the rectifier smoothing circuit 14, while the AC voltage is subjected to a resistance potential division by the fixed impedance circuit 15 and the detection resistor 16. That is, a voltage is generated at both ends of the detection resistor 16 corresponding to the current flowing in the load 26. Both end voltages of the detection resistor 16 (the detection resistor) are, after rectifier smoothing by the output voltage detection circuit 17, supplied to the control signal generator 18 to be compared with the predetermined standard voltage, and a frequency control voltage 18a and a frequency control current 18b are output in response to the result of comparison.

That is, when the detected voltage is lower than the standard voltage, the control signal generator 18 increases the frequency control voltage 18a (Vosc) and reduces the frequency control current 18b (Iosc). The variation width of the frequency control voltage (Vosc) is restricted within a range from 0.5 to 2.0 V, so that the frequency control current 18b (Iosc) is also restricted to a range corresponding to the restricted voltage range.

The current control oscillator 19 has a predetermined standard frequency, and the current control oscillator 19 is able to oscillate any frequencies 19a (Fosc) within a range restricted by the frequency control current 18b (Iosc) with a lower limit of oscillating frequency at the standard frequency. When the frequency control current 18b (Iosc) is small, the oscillating frequency 19a (Fosc) becomes low, and when the frequency control current 18b (Iosc) is large, the oscillating frequency 19a (Fosc) becomes high.

The oscillating frequency 19a (Fosc) output by the current control oscillator 19 is frequency divided to a half by the frequency divider circuit 24 comprising flip-flop circuits, and, after being converted into two signals whose phases are in antiphase from each other, two signals are supplied to the buffer circuit 25 so as to be subjected to a waveform formation such that two signals are sufficiently adjusted to drive two transistors 12c and 12d in the driving circuit 12. The above is the switching control operation of two transistors 12c and 12d in the driving circuit 12.

The driving circuit 12 is a boosting type voltage resonance circuit comprising, coils 12a and 12b, two switching transistor 12c and 12d, and a equivalent input capacity present in the input portion 13a of the piezoelectric transformer. In more detail, the coil 12a, input portion 13a, and the switching transistor 12d compose a first resonance circuit, and the coil 12b, input portion 13a, and the switching transistor 12c compose a second resonance circuit. When the switching transistor 12d and 12c are switched, an oscillation wave is generated. The oscillating wave can be formed as a half sine wave by optimizing the switching frequency to be in the zero-voltage switching.

The polarity of the equivalent input capacity present in the input portion 13a of the piezoelectric transformer, which is a common component for two resonance circuits, is the reverse for each of the two resonance circuits, so that the output waveforms generated by two resonance circuits have amplitudes with polarities opposite to each other. Furthermore, since the two resonance circuits operate alternately by the flip-flop operations of two switching transistors 12c and 12d, the driving waveform of the piezolectric transformer 13 generated at both ends of the input portion 13a is quite similar to a sine wave which is formed by combining two half sine waves which amplitudes are opposite to each other and which have different phases from each other. The reciprocal of the period of the sine wave is the driving frequency of the piezolectric transformer.

The boosting ratio of the piezoelectric transformer 13 has a frequency characteristic shown in FIG. 3A and the boosting ratio varies with change in the driving frequency like a Gaussian line shape. In these curves, peaks of the characteristic curves indicate the maximum boosting ratio which corresponds to a resonance point, and a driving frequency at the resonance point is called a resonance frequency. The frequency characteristic of the piezoelectric transformer 13 changes with an impedance connected to its output portion 13b, and the resonance frequency increases with increasing impedance. RL1 in FIG. 3A is the frequency characteristic when the impedance is 1MΩ. The frequency characteristics of the boosting ratio are shown in FIG. 3A as RL2, RL3, RL4, and RL5 when the impedance are 470 KMΩ, 220KΩ, 100 KΩ, and 51KΩ, respectively.

In the case of the piezoelectric transformer, the impedance connected to the output portion 13b is determined by the rectifier smoothing circuit 14, the fixed impedance circuit 15, the detection resistor 16, and the load 16. The impedance of the load 26 including the rectifier smoothing circuit 14 is as high as several tens of MΩ so that it can be regarded as an open end. While the detection resistor has a quite low resistance so as to be regarded as short. Thus, the frequency characteristic is generally determined by the fixed impedance circuits with a resistance of several tens of KΩ to several MΩ.

In order for the detection resistor 16 to maintain a constant value, the driving frequency of the driving circuit 12 is feedback controlled by the frequency control circuit 18b (Iosc). Thereby, the boosting ratio is determined. A sine wave having a larger amplitude with multiplication of a prescribed boosting-ratio multiple is generated at the output portion 13b of the piezoelectric transformer 13. The sine wave generated at the output portion 13b is rectifier smoothed by the rectifier smoothing circuit 14 and applied to the load 26 as a high DC voltage with several tens of kV.

In order to control the DC voltage applied to the load 26 or to change the source voltage at the fixed output voltage, two methods, one of which is a method to control the boosting-ratio of the piezoelectric transformer and the other one of which is a method to control the driving waveform, can be applied together.

Figure 3B:
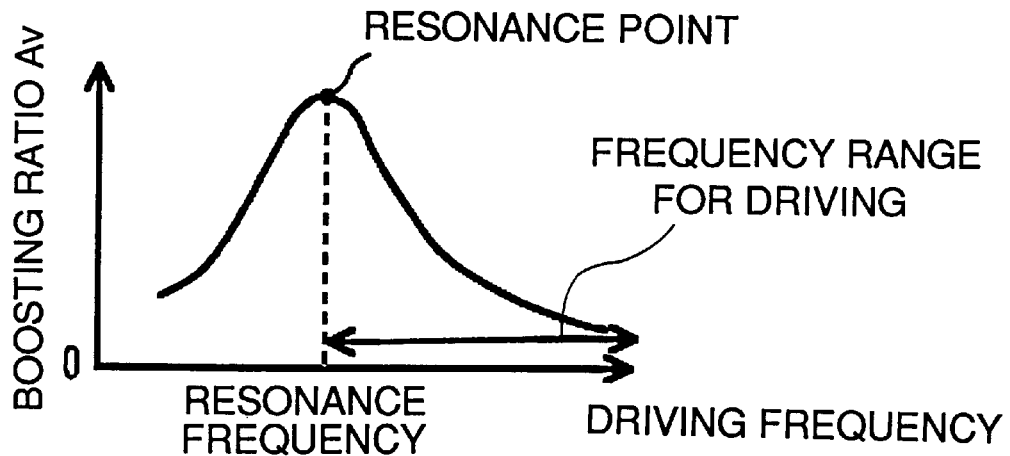

FIG. 3B illustrates a frequency characteristic, when an impedance connected to the piezoelectric transformer is fixed at a constant value. As seen in the figure, if a frequency which is in a region higher than the resonance frequency is used for driving the piezoelectric transformer 13, it is possible to obtain any boosting ratio depending upon the driving frequency. Thus, the high voltage supplied to the load 26 can be variably adjusted by changing the driving frequency.

The driving frequency and the boosting-ratio can be variably adjusted within the oscillating frequency range of the current control oscillator 19 by variably changing the resistance of the detection resistor and the detection voltage. However, it is rendered necessary to use this together with a method to control the driving frequency of the piezoelectric transformer 13, since, when the driving frequency is varied in a wide range for controlling the boosting-ratio, the varied frequency may move apart from the optimized frequency of the driving circuit 12, which results in the following two problems.

Figure 3C:
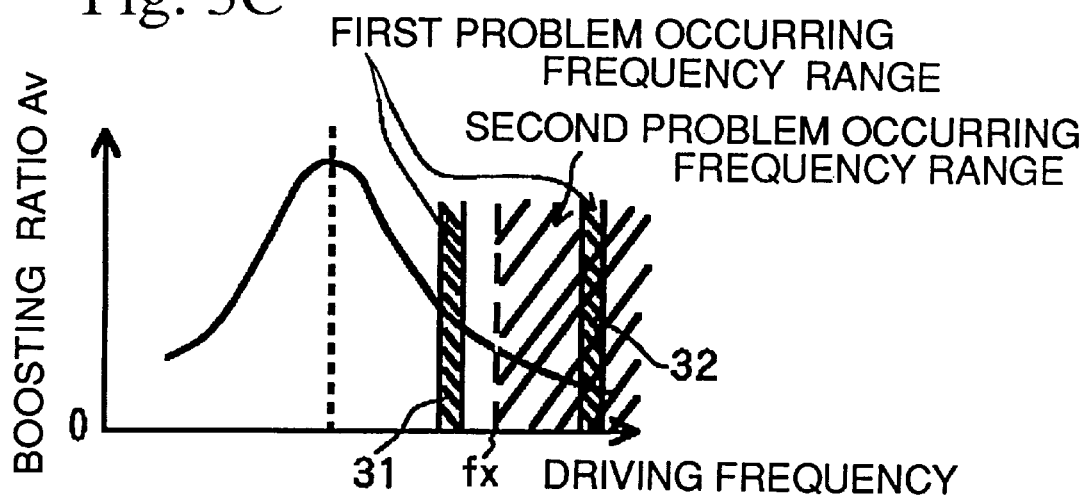
Figure 4:
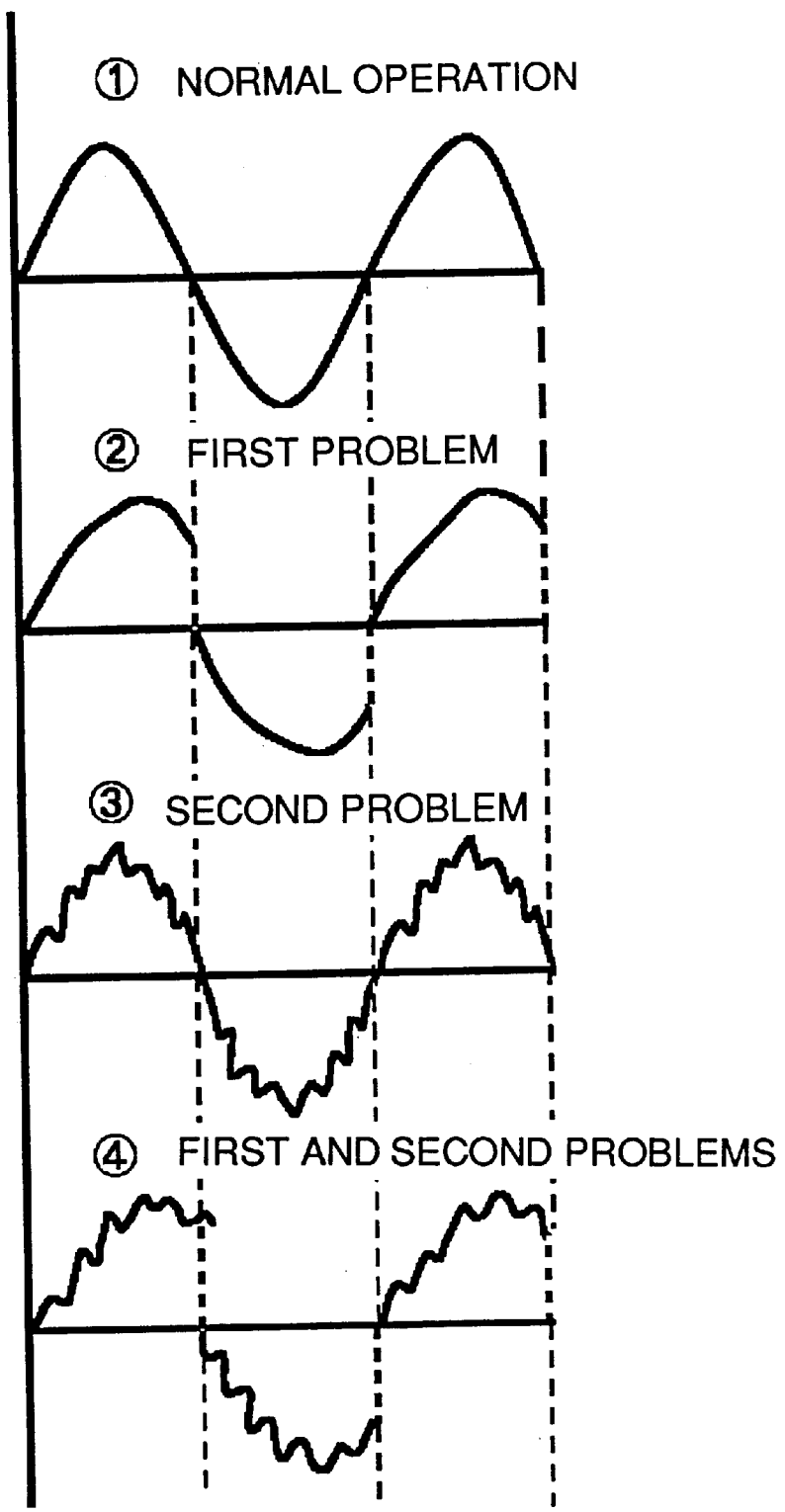
FIG. 4 is a diagram showing the driving waveform at normal operation and broken waveforms caused by problems of the conventional systems.

FIGS. 3C and FIG. 4 are diagrams to explain the above mentioned two problems. The first problem caused accompanied by the change of the driving frequency is a reduction in efficiency and heat generation which occurs when the frequency reaches a natural frequency determined by the vibrating mode, the element structure, the element size and the driving method. The sine wave of normal operation shown in FIG. 4 by mark ① changes to an broken sine wave shown in FIG. 4 by mark ②, when the driving frequency reaches the natural frequency. Since the broken sine wave is not in the state of the zero voltage switching, the above first problem is generated. The first problem occurs in a higher frequency range than the natural frequency, as indicated by fx in FIG. 3C.

The second problem generated by the change of the driving frequency is distortion of the driving waveform caused by superimposing the higher harmonic component on the driving frequency as shown in FIG. 4 by mark ③. The distortion of the waveform causes unnecessary vibration of the piezoelectric transformer, which results in a reduction in the reliability of the transformer. This second problem occurs in a comparatively narrow frequency range indicated in FIG. 3C by numerals 31 and 32.

Since the driving frequency range in which the first and second problems occur differs by the vibration mode, the element structure, the element size and the driving method of the piezoelectric transformer, the first and second problems are not always associated with each other. However, there is a situation in which the broken waveform and the superimposition of the higher harmonic component overlap.

In order to avoid occurrence of the above first and second problems, that is, in order to avoid driving at a frequency range in which the first and second problems occur, it is necessary to change the driving frequency without changing the output power by controlling the amplitude of the driving frequency.

The frequency control voltage 18a (Vosc) of the control signal generator 18 and the driving frequency of the piezoelectric transformer 13 shown in FIG. 1 have a relationship that, when the control voltage Vsoc increases, the driving frequency decreases and the driving frequency increases with decreasing control voltage Vsoc. The lowest frequency at which the two problems first start to occur is first obtained, and the frequency control voltage 18a (Vsoc) at the lowest frequency is set at a standard voltage Vrefc of the standard power source 23 as a first threshold voltage for the hysteresis comparator 20. A predetermined voltage which is lower than the first threshold voltage and which is a little higher than the voltage corresponding, to the resonance frequency is set as the second threshold voltage in the hysteresis comparator 20.

Thereby, when the frequency control voltage 18a (Vosc) to be input is the standard voltage (the first threshold value) Vrefc, and the output duty-ratio of the source control circuit 21 is 100%, the hysteresis comparator 20 outputs a high level signal. When the source control circuit 21 receives this high level signal, the source control circuit outputs a pulse signal having a duty-ratio of 50% at the oscillating frequency (symmetrical rectangular wave) to the control terminal 22a of the switching element 22. Thereby, the switching element 22 executes the on/off switching operation at a cycle corresponding to the oscillating frequency 19a (Fosc) and at the duty-ratio of 50%.

While, the hysteresis comparator 20 output a low level signal when the frequency control voltage 18a to be input is the second threshold voltage (less than the standard voltage Vrefc) and the output duty-ratio of the source control circuit 21 is 50%. When the source control circuit 21 receives this low level signal, the source control circuit 21 outputs a signal with a duty-ratio of 100% to the control terminal 22a of the switching element 22. Accordingly, the switching element 22 executes a normally-on operation.

FIG. 11A shows a relationship between a duty-ratio of the source control circuit 21 and the frequency control voltage 18a (Vosc). As seen in the figure, there is a fixed difference between the first threshold voltage (Vrefc) at which the duty-ratio is switched from 100% to 50% and the second threshold voltage at which the duty-ratio is switched from 50% to 100%. That is, the hysteresis characteristic is given such that, when the source voltage is fixed, the output voltage at the time of switching from the pulse width control with the duty-ratio of 50% to the non-control condition with the duty-ratio of 100% is higher than the voltage at the time of switching from the non-control condition to the pulse width control; and when the output voltage is fixed, the source voltage of switching from the pulse width control to the non-control condition is lower than that of switching from non-control to the pulse width control.

When the switching element is normally in the on state, all the voltage supplied by the power source (DC) is input into the driving circuit 12. The input voltage to the driving circuit 12 is in the form of a direct current wave as shown in FIG. 2B, and when this input voltage is supplied to the driving circuit, the driving wave which can be regarded as the sine wave shown in FIG. 2B is generated as the waveform at both ends of the input portion 13a of the piezoelectric transformer 13, and the thus generated driving wave drives the piezoelectric transformer 13.

When the switching element executes an on/off operation at an cycle which is reciprocal to the oscillating frequency 19*a* (Fosc) with the duty-ratio of 50%, the power is supplied intermittently from the power source (DC) 11 and a half of the power, when compared to the normally on operation (the duty ratio of 100%) is supplied to the driving circuit 12. The input voltage is in the form of a rectangular wave, and this input voltage supplied to the driving circuit 12 generates a driving wave approximately similar to the sine wave, shown in FIG. 2D, as the voltage waveform at both ends of the input portion 13*a* of the piezoelectric transformer 13 to drive the piezoelectric transformer. When an on/off operation is executed by the switching element, the driving wave shifts to a sine wave, as shown in FIG. 2D, having a smaller amplitude than that of the wave generated by the normally-on operation shown in FIG. 2B.

Figure 6A:
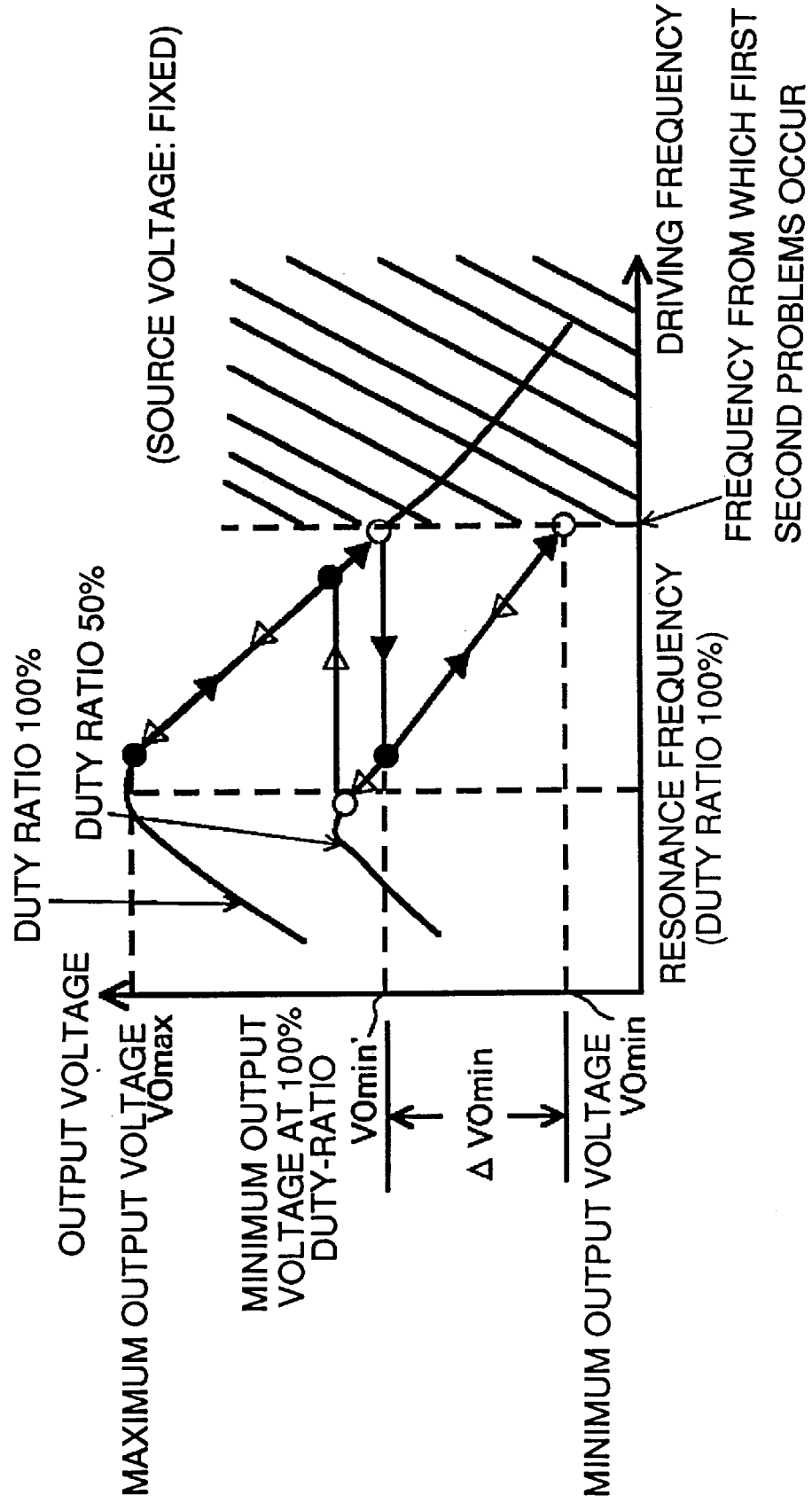
FIG. 6A and 6B are measures for problems adopted by the present invention.

As described hereinabove, a characteristic curve is obtained as illustrated in FIG. 6A, which shows the relationship between the driving frequency of the piezoelectric transformer and the output voltage. In more detail, as seen in the figure, the maximum output voltage is obtained, when the driving frequency is the resonance frequency. Until the driving frequency reaches the natural frequency where the problem occurs, the driving frequency is increased by increasing the feedback output voltage by variably adjusting the resistance of the detection resistor 16; thereby the boosting ratio is decreased from that at the maximum output voltage. When the driving frequency reaches the natural frequency (that is, when the hysteresis comparator 20 detects that the control voltage Vosc is the same as the first threshold value), the source control circuit 21 receives the output signal from the hysteresis comparator 20 and makes the switching element 22 switch into the duty-ratio of 50%.

Consequently, since the power supply to the driving circuit 12 decreases, and the amplitude of the driving wave, as shown in FIG. 2D, is reduced to lower than that of the driving wave shown in FIG. 2B, the output voltage is detected and feedback controlled by the output voltage detection circuit 17 is decreased and, as shown in FIG. 6A, the driving frequency is reduced to a frequency which is slightly higher than the resonance frequency. At this low amplitude state, the minimum output voltage can be obtained, when the driving frequency reaches the natural frequency by increasing the driving frequency by the variable adjustment of the resistance of the detection resistor 16. As a result, it is possible to obtain any output voltages in a range extending from the maximum output voltage to the minimum output voltage.

It is also possible to change the output voltage from the lower voltage to the higher voltage in the opposite direction. In this case, contrary to the above operation, the source control circuit 21 variably adjusts the detection resistor 16 to reduce the driving frequency under a condition that the switching element is operated at the duty-ratio of 50%, and when the driving frequency reaches a predetermined frequency which is slightly higher than the resonance frequency (that is, when the hysteresis comparator 20 detects that the control voltage Vosc is the same as the second as the second threshold value), the source control circuit 21 receives the output signal from the hysteresis comparator and switches the switching element 22 to the normally on state at the duty-ratio of 100%. Thereby, since the power supply to the driving circuit increases and the amplitude of the driving wave increases as shown in FIG. 2B from the amplitude shown in FIG. 2D, the output voltage increases are detected and feedback controlled by the output voltage detection circuit 17, and the driving frequency increases to a frequency slightly lower than the natural frequency. At this high amplitude state, when the driving frequency is reduced until the driving frequency reaches a predetermined frequency which is slightly higher than the resonance frequency, the maximum output voltage is obtained. Consequently, it is possible to obtain any output voltage within a range extending from the minimum output voltage to the maximum output voltage.

According to this embodiment, it is understood that an output range, which can be used without causing any problems in terms of the driving frequency, can be increased from the minimum output voltage VOmin at the duty-ratio of 50% to the minimum output voltage VOmin' at the duty-ratio of 100% (which corresponds to the conventional minimum output voltage), and that the output range can be increased as many as $\Delta$VOmin. As hereinabove described, the driving wave amplitude at the above natural frequency can be controlled by judging threshold values of the frequency control voltage 18*a* (Vosc) and by giving hysteresis to the threshold values, so that a shortage of the driving frequency at the time of switching is avoided. That is, as shown in FIG. 6A, when the source voltage is fixed, the output voltage VOmin' for switching at the natural frequency the duty-ratio from 100% to 50% while increasing the driving frequency to the natural frequency in operation at the duty-ratio of 100% is lower than the output voltage for switching the duty-ratio from 50% to 100% at a frequency slightly higher than the resonance frequency, while decreasing the driving frequency in operation of the duty-ratio of 50%.

Figure 6B:
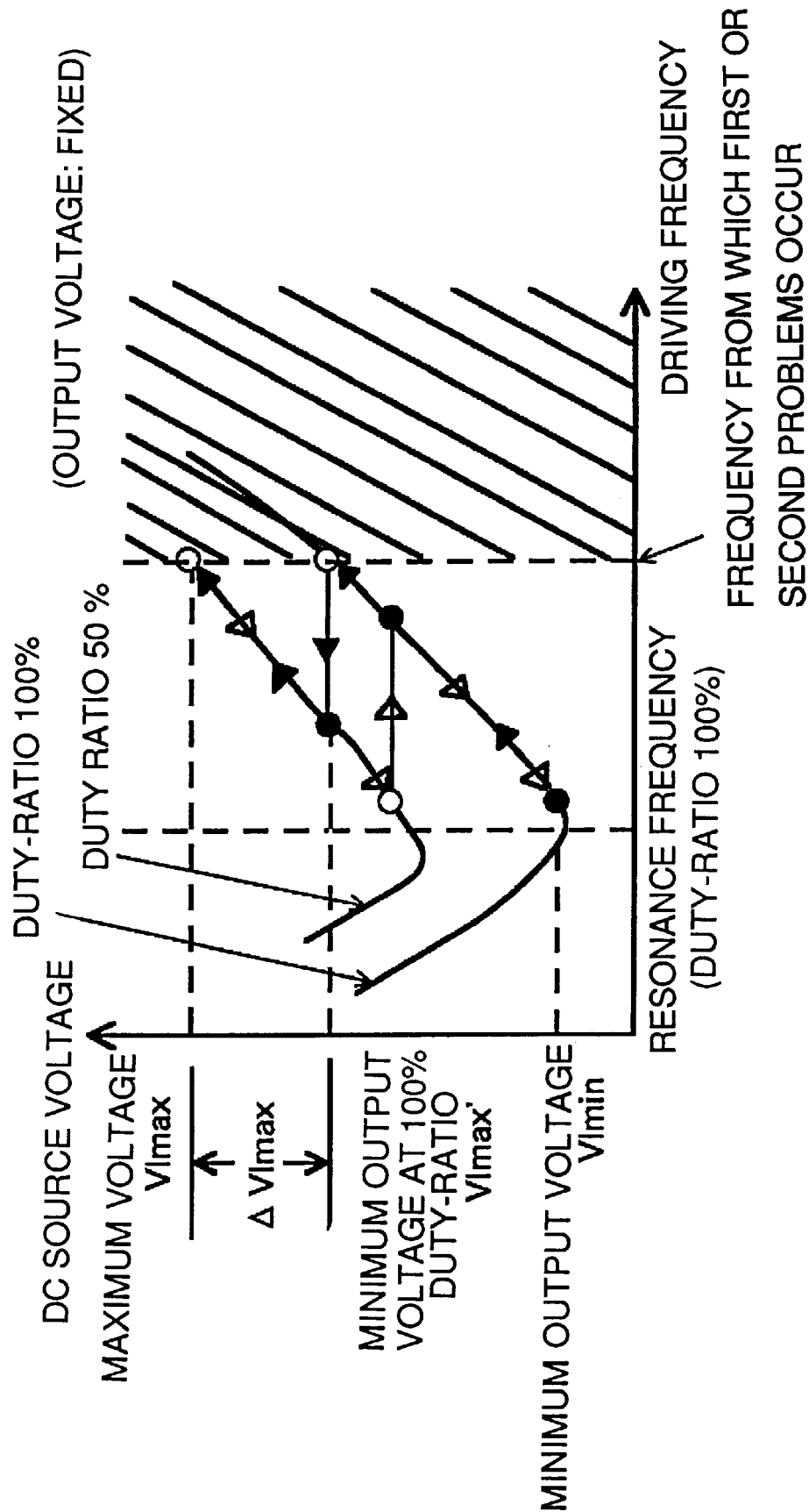

While, when the output voltage is fixed, a relationship between the driving frequency of the piezoelectric transformer 13 and the source voltage applied to the driving circuit 12 is obtained as shown in FIG. 6B. As seen in the figure, in the operation of the duty-ratio of 100%, the minimum source voltage is obtained when the driving frequency is a predetermined frequency which is slightly higher than the resonance frequency. When the source voltage is increased, the driving frequency also increases until the natural frequency where the problems occur (that is, the hysteresis comparator 20 detects that the control voltage Vosc is the same as the first threshold value), the source control circuit 21, after receiving the signal from the hysteresis comparator 20), makes the switching element 22 switch to operation at the duty-ratio of 50% in order to reduce the driving frequency without changing the source voltage.

Furthermore, in this case, the resistance of the detection resistor 21 is fixed, and the feedback loop comprising the fixed impedance circuit 15, the detection resistor 16, the output voltage detection circuit 17, the control signal generator 18, current control oscillator 19, the frequency dividing circuit 24, the buffer circuit 25, and the driving circuit 12 is operated to fix the output voltage. However, when the source voltage of the power source 11 is altered, the output control voltage 18*a* of the control signal generator 18 changes immediately after the change of the source voltage.

This brings a reduction of supply of the power to the driving circuit and the amplitude of the driving frequency is reduced, as shown in FIG. 2D, to lower than the amplitude of the driving frequency shown in FIG. 2B, so that the output voltage detected by the output voltage detection circuit 17 and fed back to the driving circuit 12 are also reduced and the driving frequency is reduced to a frequency slightly higher than the resonance frequency, as shown in FIG. 6B.

When the source voltage is increased during the low frequency operation at the duty-ratio of 50%, the driving frequency increases and the maximum source voltage is obtained when the driving frequency reaches the natural frequency. That is, any source voltage can be obtained within a voltage range from the minimum source voltage to the maximum source voltage.

In contrast, it is possible to change the source voltage from a higher voltage to a lower voltage. This change is achieved, when the source voltage is increased, during an operation where the source control circuit 21 is maintaining the switching element 22 to operate at the duty-ratio of 50%, and when the driving frequency reaches a predetermined value which is slightly higher than the resonance frequency (that is, the hysteresis comparator 20 detects that the control voltage is the same as the second threshold value), the source control circuit 21 receives the output signal from the hysteresis comparator 20 and switches the switching element 22 to operate at the duty-ratio of 100%, that is, the condition of noramally on.

As described hereinabove, since supply of power to the driving circuit 12 increases, and the amplitude of the driving wave increases as shown in FIG. 2B more than the amplitude of the driving wave shown in FIG. 2D, the driving frequency increases to a higher frequency which is slightly lower than the natural frequency. When the source voltage is decreased again during the operation at the duty-ratio of 100%, and when the driving frequency reaches a predetermined frequency which is slightly higher than the resonance frequency, the minimum source voltage can be obtained. The above procedure makes it possible to obtain any source voltage within a range from the minimum to the maximum source voltages.

As shown in FIG. 6B, in the case of the fixed source voltage, a hysteresis characteristic is provided such that the maximum source voltage VImax' obtained by switching the duty-ratio to 50% at an natural frequency in the operation at the duty-ratio of 100% is higher than the source voltage obtained by switching the duty ratio to 100% in the operation of the duty-ratio of 50% at a frequency which is slightly higher than the resonance frequency.

As shown in FIG. 6B, it is noted that the source voltage range, obtained excluding driving at the natural frequency which causes problems, extends as much as Δ VImax which corresponds to a difference between the maximum source voltage VImax' (which corresponds to the conventional maximum source voltage) in an operation at the duty-ratio of 100% and a maximum source voltage VImax in the operation at the duty-ratio of 50%. In FIGS. 6A and 6B, white circles indicate discontinuity points which are imaginary, and black circles are practically observed.

Figure 7:
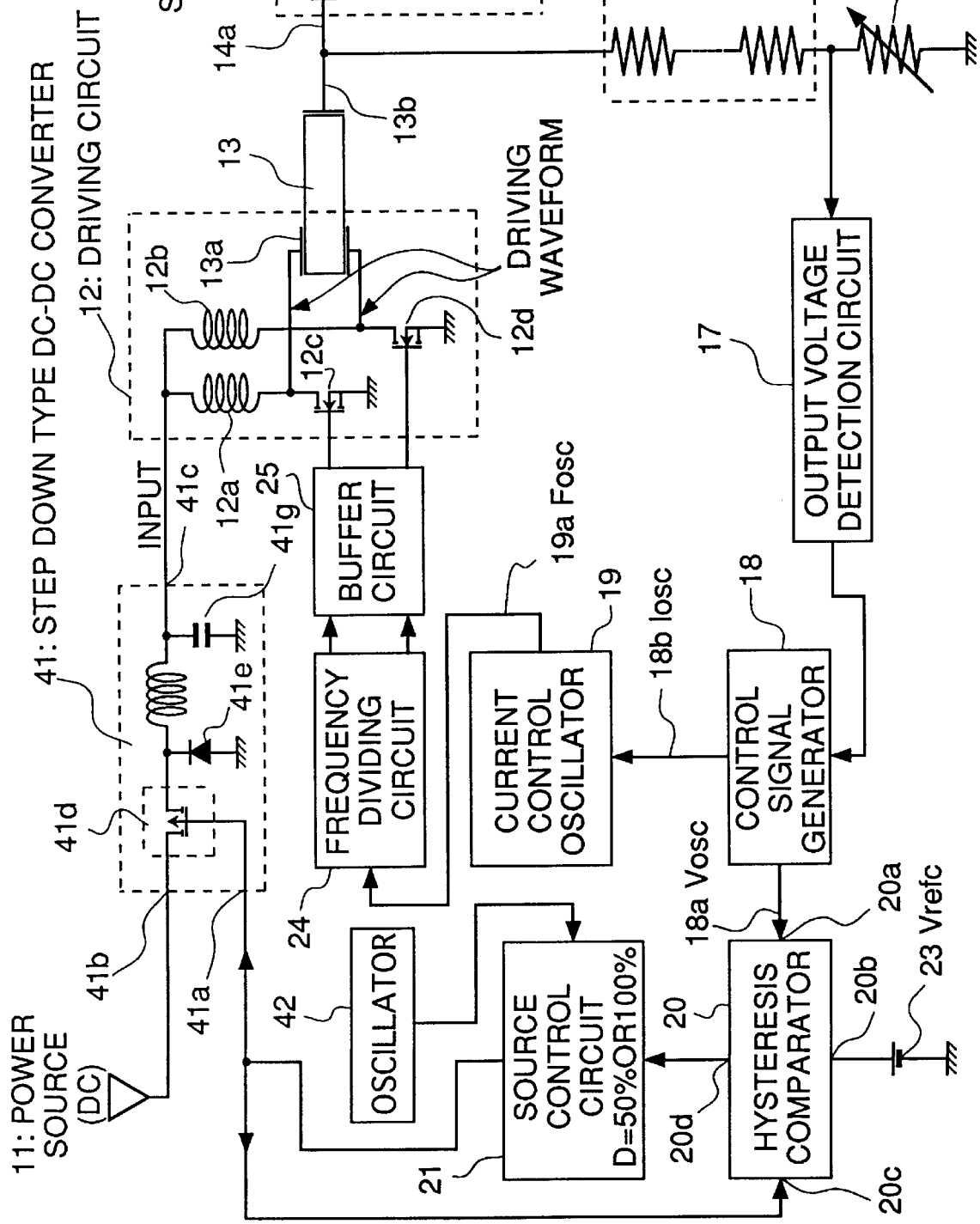
FIG. 7 shows a schematic circuit diagram of the second embodiment of the present invention.
Figure 11:
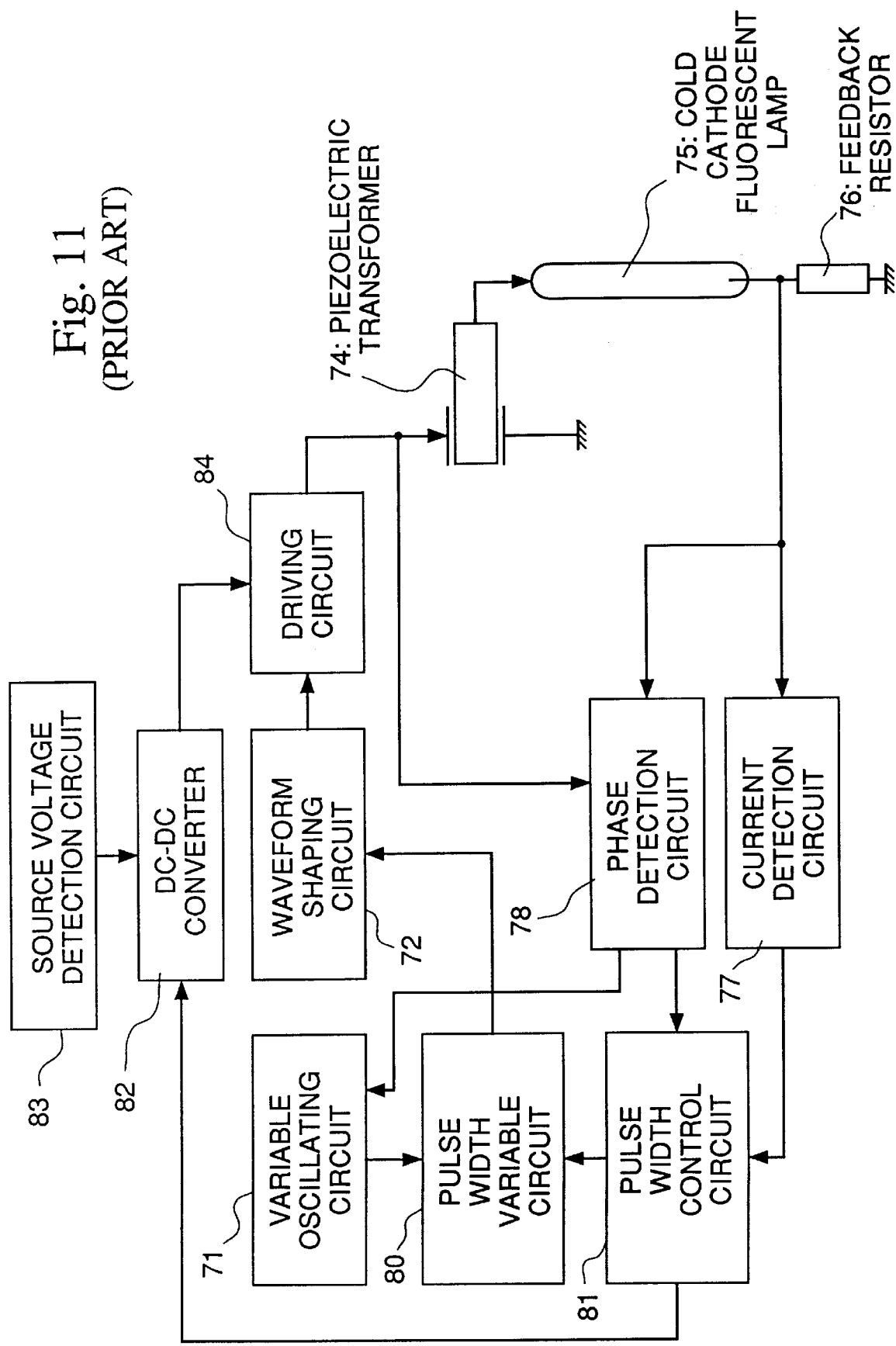
FIG. 11 is a block diagram showing another example of conventional circuits.
Figure 12:
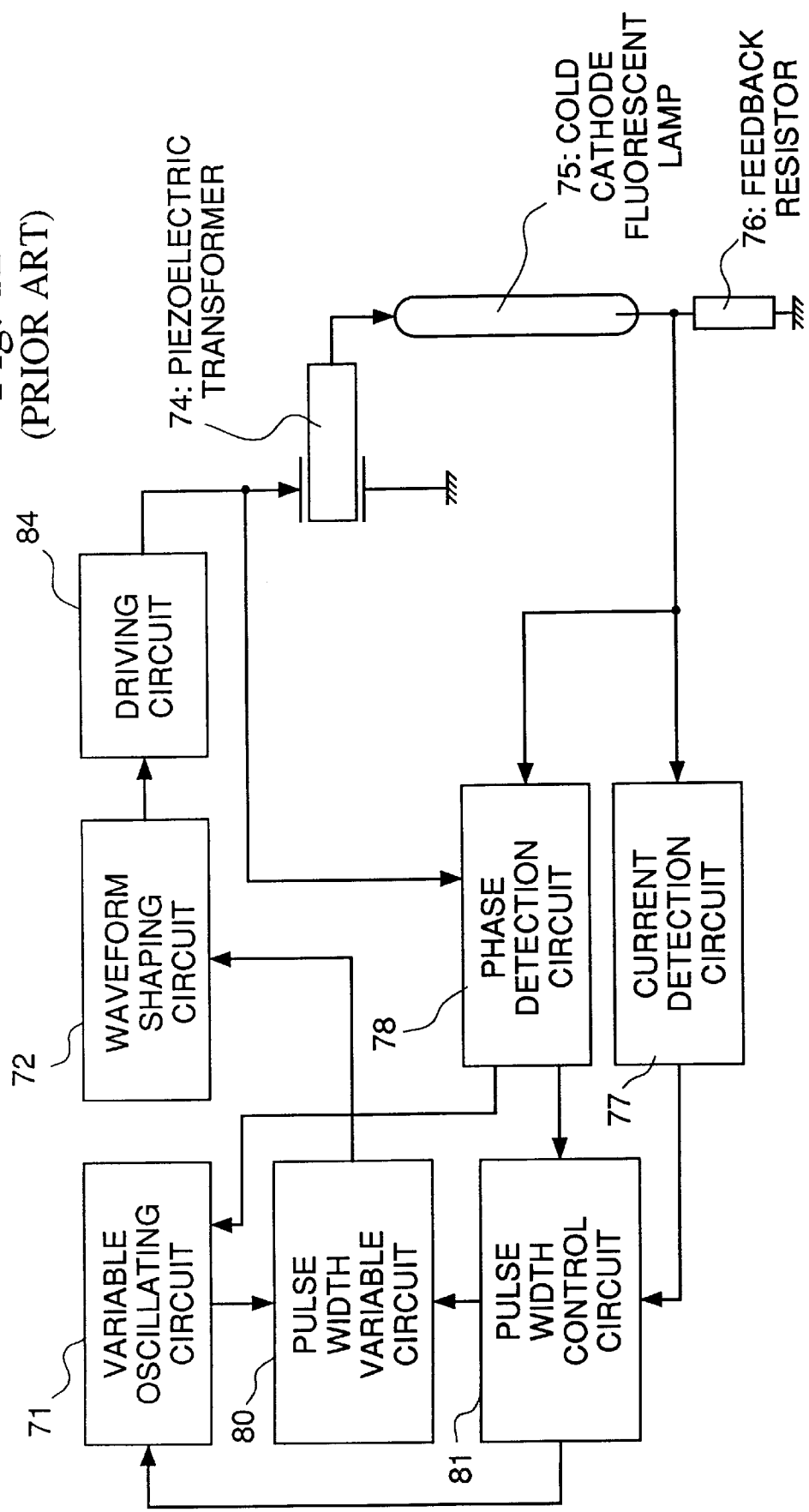
FIG. 12 is a block diagram showing still another example of conventional circuits.

The second embodiment of the present invention is described hereinafter. FIG. 7 illustrates a schematic driving circuit for driving a piezoelectric transformer. In the figure, the same components as those in FIG. 1 are marked with the same reference numbers and descriptions of those components are omitted. The second embodiment shown in FIG. 11 is characterized in the provision of a step-down DC-DC converter 41. The step-down DC-DC converter 41 has a control terminal 41a connected to the source control circuit 21, an input terminal 41b connected to the power source 11, and an output terminal 41c connected to the driving circuit 21. The step-down DC-DC converter 41 comprises a switching element 41d, a diode 41e, a coil 41f, and a condenser 41g, and one end of the coil 41f is connected to a connection between a cathode of the diode 41e and the switching element 41d. The other end of the coil 41f is connected to one end of the condenser 41g. The other end of the condenser 41g and an anode of the diode 41e are grounded, respectively. In addition, an output terminal 20d of the hysteresis comparator 20 is connected to the source control circuit 21, and the source control circuit 21 is connected to the oscillator 42.

An operation of the second embodiment will be described hereinafter. An AC voltage detected by the detection resistor 16 is input into the control signal generator 18 after being subjected to a rectifier smoothing operation by the output voltage detection circuit 17. The detected voltage after being subjected to the rectifier smoothing operation is compared with the standard voltage by the control signal generator 18. If the detected voltage is lower than the standard voltage, the control signal generator 18 increases the frequency control voltage 18a (Vosc) for output and decreases the frequency control current 18b (Iosc) for output. Conversely, if the detected voltage is higher than the standard voltage, the control signal generator 18 decreases the frequency control voltage 18a (Vosc) for output and increases the frequency control current 18b (Iosc).

The variable width of the frequency control voltage 18a (Vosc) is limited to a range of 0.5 to 2.0 V. Accordingly, the frequency control current 18b (Iosc) is also limited to a current range corresponding to the limitation of the frequency control voltage. The current control oscillator 19 has a predetermined standard frequency and is capable of oscillating at any oscillating frequency 19a (Fosc) within a limit defined by the oscillating control current 18b.

When the frequency control current 18b (Iosc) is small, the oscillating frequency 19a (Fosc) becomes low. Conversely, if the frequency control current 18a (Iosc) is large, the oscillating frequency 19a (Fosc) becomes high. Similar to the first embodiment, the oscillating frequency is frequency-divided into two halves by the frequency dividing circuit 24, and, after converted into two signals having phases opposite to each other, two signals are applied to respective control terminals of two switching transistors 12c and 12d in the driving circuit 12 to control switching.

The driving circuit 12 of this embodiment is the same as that of the first embodiment. The driving circuit 12 applies a sine wave which is generated by combining two half sine waves with phases opposite each other into both terminals of the input portion of the piezoelecrtric transformer 13, as the driving signal. The reciprocal of the cycle of the sine wave corresponds to the driving frequency of the piezoelectric transformer 13. The boosting ratio of the piezoelectric transformer has a frequency characteristic shown in FIG. 3A, and the boosting ratio changes as a convex curve with increasing driving frequency. The frequency characteristic of the piezoelectric transformer is determined by a fixed impedance with a resistance within several tens of K Ω to several M Ω.

In order to control the detection voltage detected by the detection resistor 16 at a fixed value, the driving frequency of the driving circuit 12 is subjected to feedback control by the frequency control current 18b (Iosc), which determines the boosting ratio of the piezoelectric transformer. A sine wave which has an amplitude of the boosting ratio times larger than the amplitude of the driving wave is generated at the output portion 13b of the piezoelectric transformer. The sine wave generated at the output portion 13b is subjected to a rectifier smoothing operation by the rectifier smoothing circuit 14 and supplied to the load 26 as a DC high voltage.

When it is necessary to change the DC high voltage to be applied to the load 26, or to change the source voltage in a fixed output operation, this embodiment also uses a combination of two methods, in which, one is a method to control the boosting ratio of the piezoelectric transformer and another is a method to control the driving waveform.

The hysteresis comparator 20 outputs a high level signal, when the frequency control voltage 18a (Vosc) is the standard voltage Vrefc, and the duty-ratio is 100%. When the source control circuit 21 receives the high level signal, the source control circuit 21 supplies a signal with a optional frequency determined by the oscillator 42 and with a duty-ratio of 50% to the control terminal of the switching element 41d of the step-down DC-DC converter 41 to make it execute an on/off operation at the duty-ratio of 50%.

When the input frequency control voltage 18a (Vosc) is identical with the second threshold voltage (which is less than the standard voltage Vrefc), and the duty-ratio is 50%, the hysteresis comparator 20 outputs a low level signal. When the source control circuit 21 receives the low level signal from the hysteresis comparator 20, the source control circuit 21 supplies a control signal with a duty ratio of 100% to the control terminal of the step-down DC-DC converter 41 to convert it into the normally on state.

Consequently, similar to the first embodiment, this embodiment has a relationship between the output duty ratio and the frequency control voltage 18a (Vosc) as shown in FIG. 11A. As seen in the figure, the hysteresis characteristic is provided such that, when the source voltage is fixed, the output voltage at the time of switching conditions from the pulse width control to the non-control is higher than that in switching conditions from the non-control to the pulse width control. While, when the output voltage is fixed, the source voltage at the time of switching conditions from the pulse width control to the non-control is lower than that at the time of switching conditions from the non-control to the pulse width control.

When the switching element 41d of the step-down DC-DC converter 41 is maintained in the condition of normally on, the power supplied from the power source is input into the driving circuit 12. The waveform of the input voltage to the driving circuit is the DC voltage as shown in FIG. 2A. When this input voltage is supplied to the driving circuit, a sine wave is generated as the voltage waveform at both ends of the input portion 13a of the piezoelectric transformer to drive the transformer.

When the switching element 41d conducts an on/off operation under the duty-ratio of 50% at an optional frequency from the oscillator 42, a step-down voltage which is a DC voltage and reduced to a half of that under the duty-ratio of 100% is output from the output terminal 41c of the step-down DC-DC converter 41 and the reduced DC voltage is supplied to the driving circuit 12. The input voltage waveform is a DC voltage shown in FIG. 2E, but the voltage is reduced to a half.

When this input voltage is supplied to the driving circuit 12, a voltage waveform close to the sine wave is generated at both ends of the input portion 13a of the piezoelectric transformer to drive the piezoelectric transformer. The waveform of the piezoelectric transformer at this time has a smaller amplitude than that of the waveform in the normally on operation shown in FIG. 2B.

As described hereinbefore, the resistance of the detection resistor 16 is varied to raise the driving frequency until it reaches the natural frequency, while decreasing the boosting ratio from that at the maximum output voltage. When the driving frequency reaches the natural frequency, the supply of power to the driving circuit 12 is decreased and the amplitude of the driving waveform decreases due to reduction of the driving frequency without changing the output voltage. The minimum output voltage is obtained by varying the resistance of the detection resistor and by shifting the driving frequency to the natural frequency.

Conversely, when the output voltage is fixed, the driving frequency is raised by increasing the voltage from the minimum source voltage to a natural frequency where the problems occur. When the driving frequency reaches the natural frequency, supply of the power to the driving circuit 12 is decreased and the amplitude of the driving waveform is also decreased by decreasing the driving frequency without changing the source voltage. This embodiment uses the step-down DC-DC converter 41 for reducing the supply of power. When the source voltage is again increased to the natural frequency while maintaining this small amplitude, the maximum source voltage is obtained. The control of the amplitude of the driving waveform at this natural frequency is conducted by a threshold judgement of the frequency control voltage 18a (Vosc). The deficiency of the driving frequency can be avoided by providing a hysteresis for the threshold values.

FIG. 6A shows an output voltage applied to the load 26 and the driving frequency. As shown in the figure, the output voltage range, in which the frequency causing problems are avoided, extends as much as Δ VOmin. FIG. 6B shows a relationship between the current (DC) and the driving frequency. The output current extends as much as Δ VImax.

Figure 8:
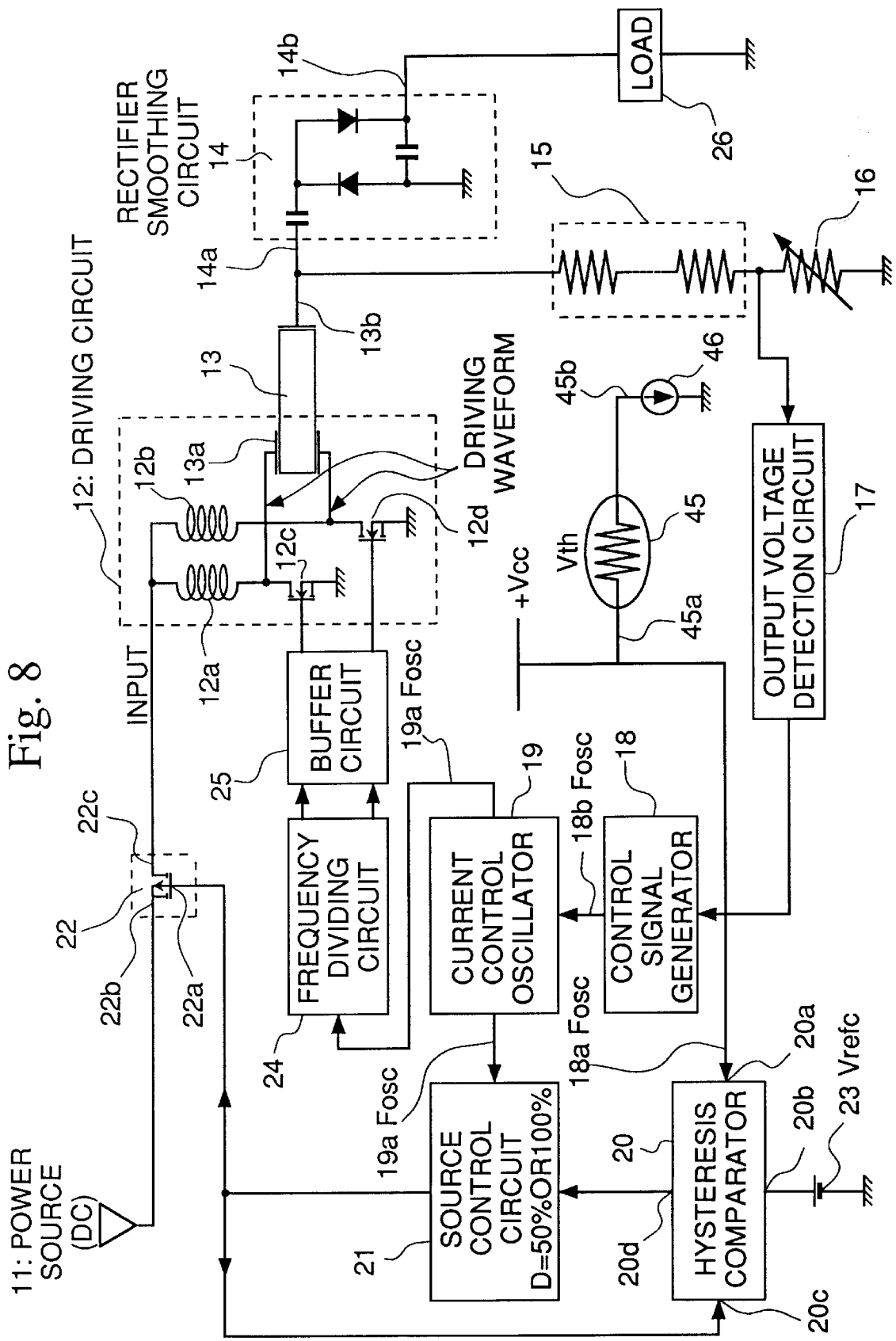
FIG. 8 shows a schematic circuit diagram of the third embodiment of the present invention.

The third embodiment of the present invention is described hereinafter. The schematic circuit diagram of the driving apparatus of the piezoelectric transformer according to the third embodiment of the present invention is shown in FIG. 8. The same components in the figure as those of FIG. 1 are shown using the same reference numerals, and the explanation of those components is omitted. The third embodiment is characterized in the provision of a thermistor 45.

In FIG. 6, the thermistor 45 is physically adhered to two switching transistors 12c and 12d in the driving circuit 12. One end of the thermistor 45 is connected to a first terminal of the hysteresis comparator 20 as well as any power source, and another end is grounded through a fixed current source 46. A standard voltage source 23 for generating a standard voltage Vrefc is connected to the output terminal 20d of the hysteresis comparator 20. An output of the source control circuit 21 is connected to a control terminal 22a of a switching element 22 and the third input terminal 20c of the hysteresis comparator 20.

The operation of this third embodiment is described hereinafter. The AC voltage detected by the detection resistor 16 is subjected to the rectifier smoothing operation by the output voltage detection circuit 17 and input into the control signal generator 18. The detected voltage after being subjected to the rectifier smoothing operation is compared with a predetermined standard voltage. If the detected voltage is lower than the standard voltage, the control signal generator 18 decreases the output frequency control current 18b (Iosc). If the detected voltage is higher than the standard voltage, the control signal generator increases the output frequency control current 18b (Iosc). The frequency control signal 18b (Iosc) is limited within a predetermined current range.

The current control oscillator 19 has a predetermined standard frequency, and it is possible to oscillate any oscillating frequency within a predetermined frequency range restricted by the above frequency control current 18b (Iosc). When the frequency control current 18b (Iosc) is small, the current control oscillator 19 reduces the oscillation frequency 19a (Fosc), and when the frequency control current 18b (Iosc) is large, the current control oscillator 19 increases the oscillation frequency 19a (Iosc).

The oscillation frequency 19a is, similar to the first and second embodiments, divided into two frequency signals with phases opposite to each other by the frequency dividing circuit 24 and applied to the control terminals of two switching transistors 12c and 12d in the driving circuit 12 and is used to control the switching operation.

The driving circuit 12 has the same construction as those of the first and second embodiment. The roughly sine wave, formed by combining two half sine waves with opposite polarities and with opposite phases from each other, is applied to the both ends of the input portion 13a of the piezoelectric transformer. The reciprocal of the cycle of this sine wave is the driving frequency of the piezoelectric transformer. The boosting ratio of the piezoelectric transformer has a frequency characteristic as shown in FIG. 3A, and, as stated earlier, the driving frequency changes with the boosting ratio as a convex curve. The frequency characteristic of the piezoelectric transformer is determined by the fixed impedance circuit 15 having a resistance range from several tens of KΩ to several MΩ.

In order to control a detection voltage detected by the detection resistor 16 at a fixed value, the driving frequency of the driving circuit is feedback controlled by the frequency control current 18b (Iosc). A sine wave with a boosting ratio multiple times larger amplitude than that of the driving waveform is generated at the output portion 13b of the piezoelectric transformer 13. The generated sine wave is, after subjected to the rectifier smoothing operation by the rectifier smoothing circuit 14, supplied to the load 26 as the high DC voltage with more than several KV.

This embodiment uses a combination of two methods, one of which is a method of controlling the boosting ratio for changing the source voltage at the time of fixed output, and another of which is a method to control the driving frequency of the piezoelectric transformer 13. As explained earlier with reference to FIG. 3B, any optional boosting ratio can be obtained depending upon the driving frequency can be obtained, when a higher range of driving frequency than the resonance frequency is used for driving the piezoelectric transformer 13. Thereby, the high DC voltage applied to the load 26 can be variably adjusted by changing the driving frequency.

For changing the driving frequency, the frequency control current 18b (Iosc) is changed by variably controlling the detection voltage by the change of the resistance of the detection resistor 16, and then the boosting ratio can be controlled within a range of the oscillating frequency of the current control oscillator 19. However, if the driving frequency is widely changed for ① controlling the boosting ratio, it is inevitably necessary to use the method of controlling the driving frequency of the piezoelectric transformer, since two switching transistors will encounter a problem of heat generation as the driving frequency departs from the frequency which is obtained at the time of optimizing the driving circuit 12.

FIGS. 3C and 4 are diagrams for explaining problems. When the driving frequency reaches a natural frequency determined by the vibration mode of the piezoelectric transformer, the element structure, the element size, and the driving method of the apparatus, the driving waveform begins to shift from the zero voltage switching condition (FIG. 4,①) and causes a problem. That is, the problem is a heat generation of switching transistors 12c and 12d of the driving circuit 12. In order to avoid this problem, it is necssary to change the driving frequency without changing the output by controlling the driving waveform.

In order to understand the natural frequency at which the problems occur, a thermistor 45 adhered to two transistors 12c and 12d is used for detecting the heat generation of the driving circuit. The generated heat is detected by the thermistor 45 as a voltage converted from the heat. The thermistor voltage Vth is set in the standard voltage source 23 as a first threshold voltage Vrefc. The second threshold voltage is set as a voltage slightly lower than the first threshold voltage Vrefc.

When the thermistor voltage Vth to be input in the hysteresis converter 20 attains the value of Vrefc, and the output duty-ratio of the source control circuit is set at 100%, the hysteresis comparator 20 outputs a high level signal. When the high level signal is inputted from the hysteresis comparator 20, the source control circuit 21 outputs a signal with a cycle of the reciprocal of the oscillating frequency 19a (Fosc) and with a duty-ratio of 50% to the control terminal 22a of the switching element 22 to conduct an on/off operation.

When the thermistor voltage Vth reaches the second threshold voltage (which is lower than the standard voltage Vrefc), and when the output duty-ratio of the source control circuit 21 is 50%, the hysteresis comparator 20 outputs a low level signal. When the low level signal is input from the hysteresis comparator 20, the source control voltage 21 outputs a signal of the duty-ratio of 100% at the control terminal 22a of the switching element 22 to control the switching element 22 in the normally on condition.

FIG. 11 shows a relationship between the output duty-ratio and the thermistor voltage. As shown in the figure, there is provided a fixed difference between the first threshold voltage which is a switching voltage of the duty-ratio from 100% to 50% and a second threshold voltage which is a switching voltage of the duty ratio from 50% to 100%. That is, when the source voltage is fixed, the output voltage of switching from the pulse width control to the non-control is higher than the output voltage of switching from the non-control to the pulse width control. When the output voltage is fixed, the source voltage of switching from the pulse width control to the non-control is lower than the source voltage of switching from the non-control to the pulse width control. This difference provides a hysteresis characteristic in the method of driving the piezoelectric transformer.

When the switching element 22 is operated in the normally on condition, the power supplied by the power source 11 is wholly input in the driving circuit 12. The waveform of the input voltage to the driving circuit 12 is DC voltage as shown in FIG. 2A, and when this input voltage is supplied to the driving circuit 12, a sine wave is generated at both ends of the input portion 13a of the piezoelectric transformer 13 as the voltage waveform, and the sine wave is used to drive the piezoelectric transformer as shown in FIG. 2D. The driving waveform of the piezoelectric transformer 13 during the on/off operation of the switching element 22 has, as shown in FIG. 2D, a smaller amplitude than that at the normally on operation shown in FIG. 2B As described hereinabove, when the source voltage is fixed, the operation of the piezoelectric transformer is carried out at the duty-ratio of 100% until the driving frequency reaches the natural frequency while increasing the driving frequency by variably changing the detection resistor 16 and decreasing the boosting ratio from that at the maximum output voltage. When the driving frequency reaches a specified frequency that causes problems, the output signal of the source control circuit 21 is changed to the duty-ratio of 50% for reducing the driving frequency without changing the output voltage, and supply of the power to the driving circuit is reduced to decrease the amplitude of the driving waveform. By changing the resistance of the detection resistor 16 in this small amplitude state, the minimum output voltage VOmin is obtained by increasing the driving frequency to a frequency at which the first and second problems are generated.

Conversely, when the output voltage is fixed, the driving frequency is increased from the minimum source voltage VImin to the frequency at which problems may occur, while the output voltage of the source control circuit is maintained at the duty ratio of 100%. When the driving frequency reaches a frequency at which the first or second problems may occur, the duty-ratio of the output signal of the source control circuit 21 is switched to 50% to reduce the supply of power to the driving circuit 12 and to reduce the amplitude of the driving wave. While maintaining the amplitude at a small level, the source voltage is again increased until the driving frequency reaches the specified frequency, at which the problems may occur, to obtain the maximum source voltage VImax.

The specified frequency at which the problems may occur can be detected by using a thermistor voltage generated by a thermistor 45 which is physically attached to the switching transistors 12c and 12d. The amplitude of the driving waveform is conducted by the threshold judgement of the thermistor voltage. The instability of the driving frequency at switching of the duty-ratio can be avoided by providing the hysteresis for the threshold voltages.

The output voltage range which can be used without driving at the specified frequency, which causes problems, can be extended as much as Δ VOmin as shown in FIG. 6A. The source voltage range can be similarly extended by Δ VImax as shown in FIG. 6B.

Figure 5A:
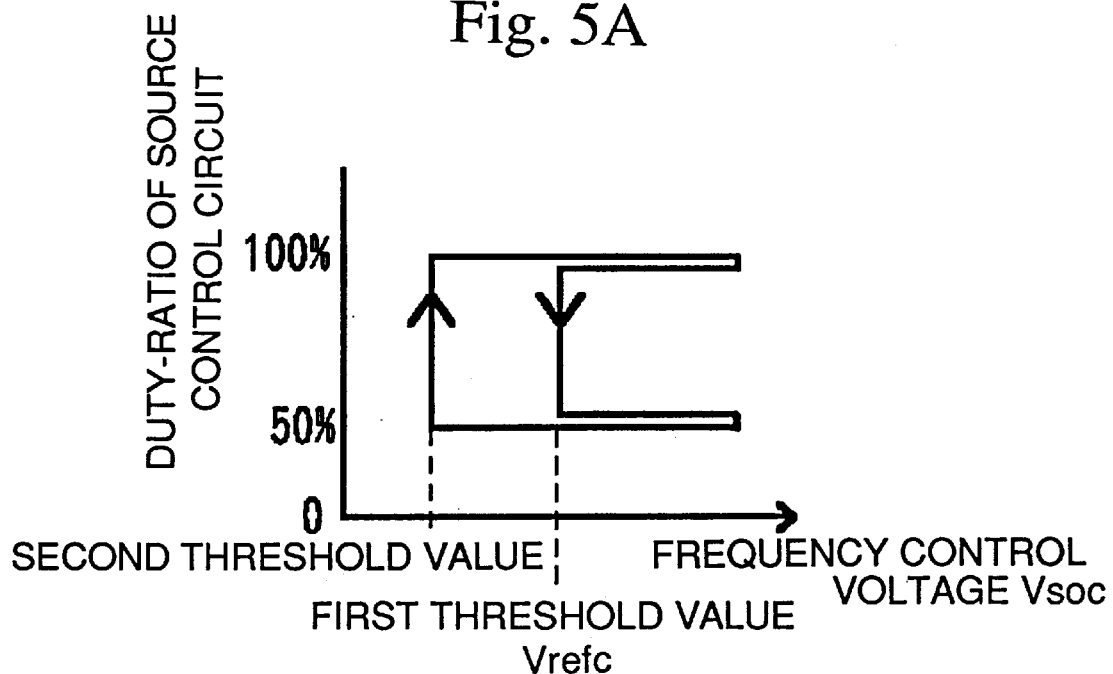
FIG. 5A and 5B are diagrams showing the switching operation of the duty-ratios.
Figure 5B:
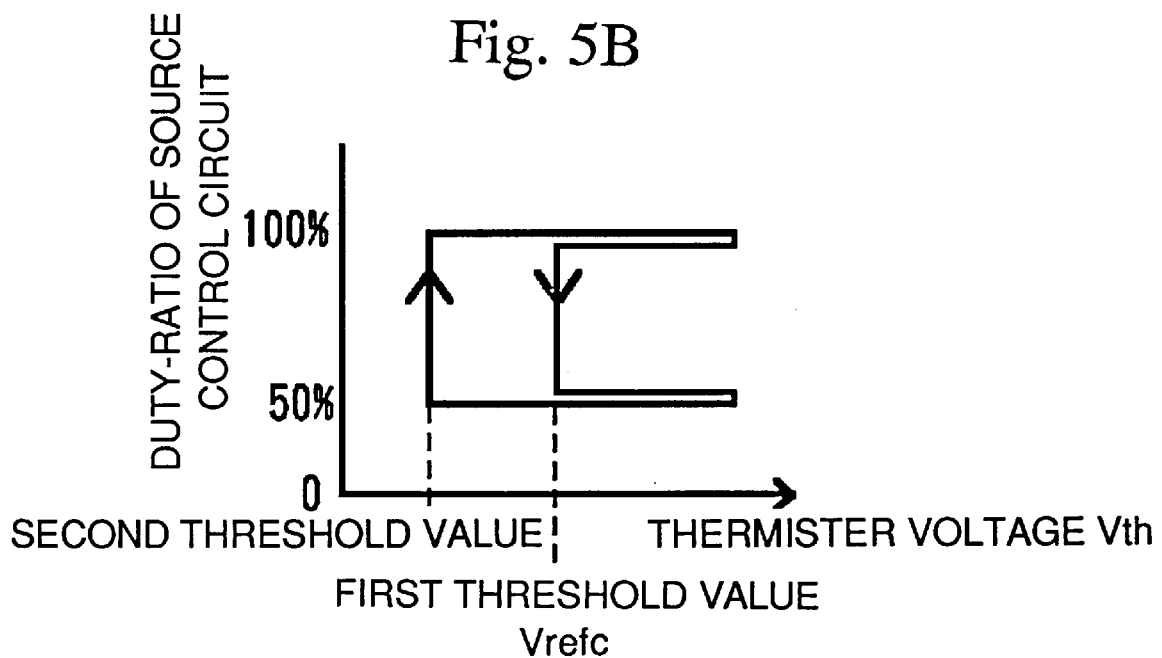
Figure 9:
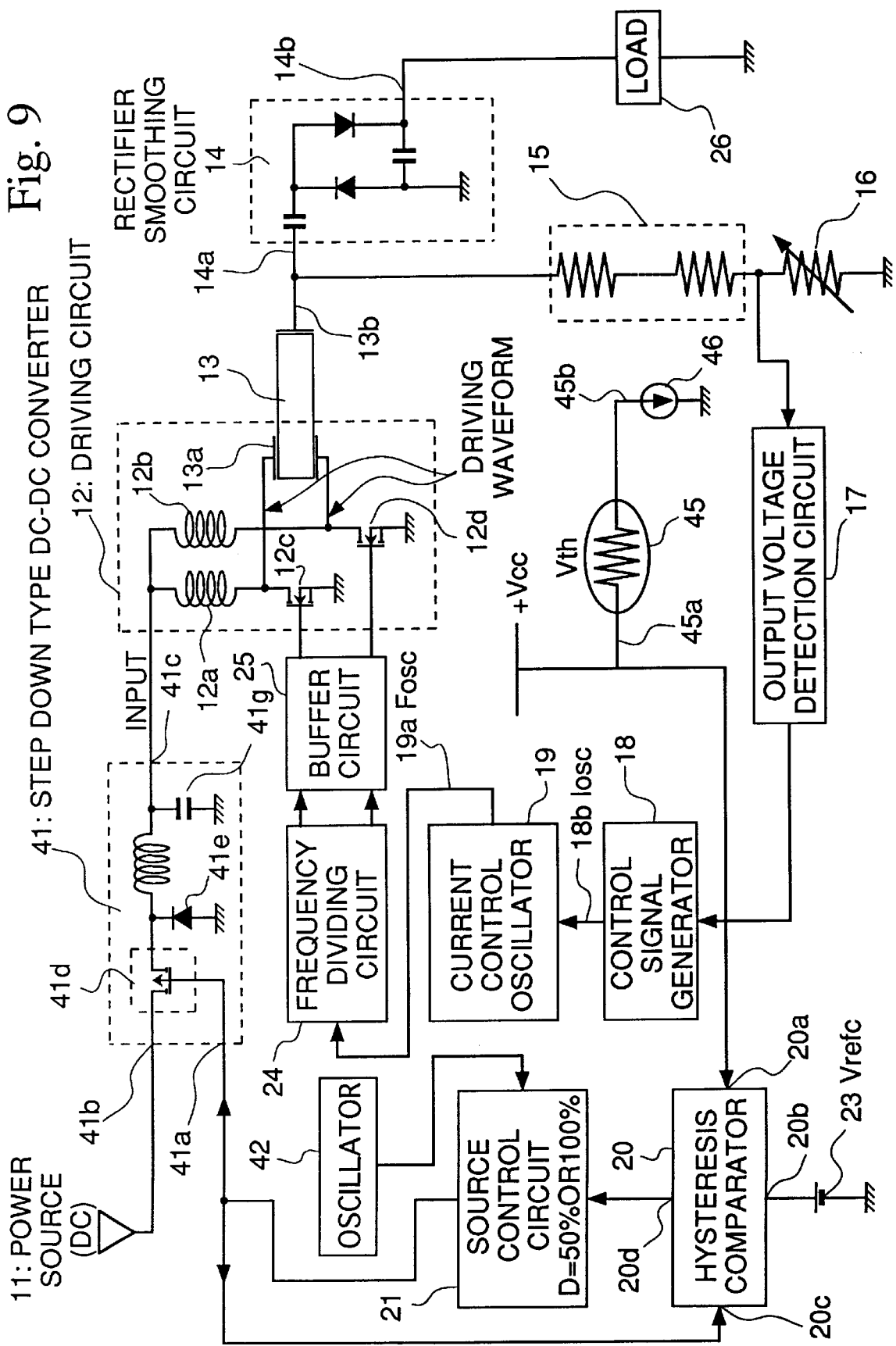
FIG. 9 shows a schematic circuit diagram of the fourth embodiment of the present invention.
Figure 10:
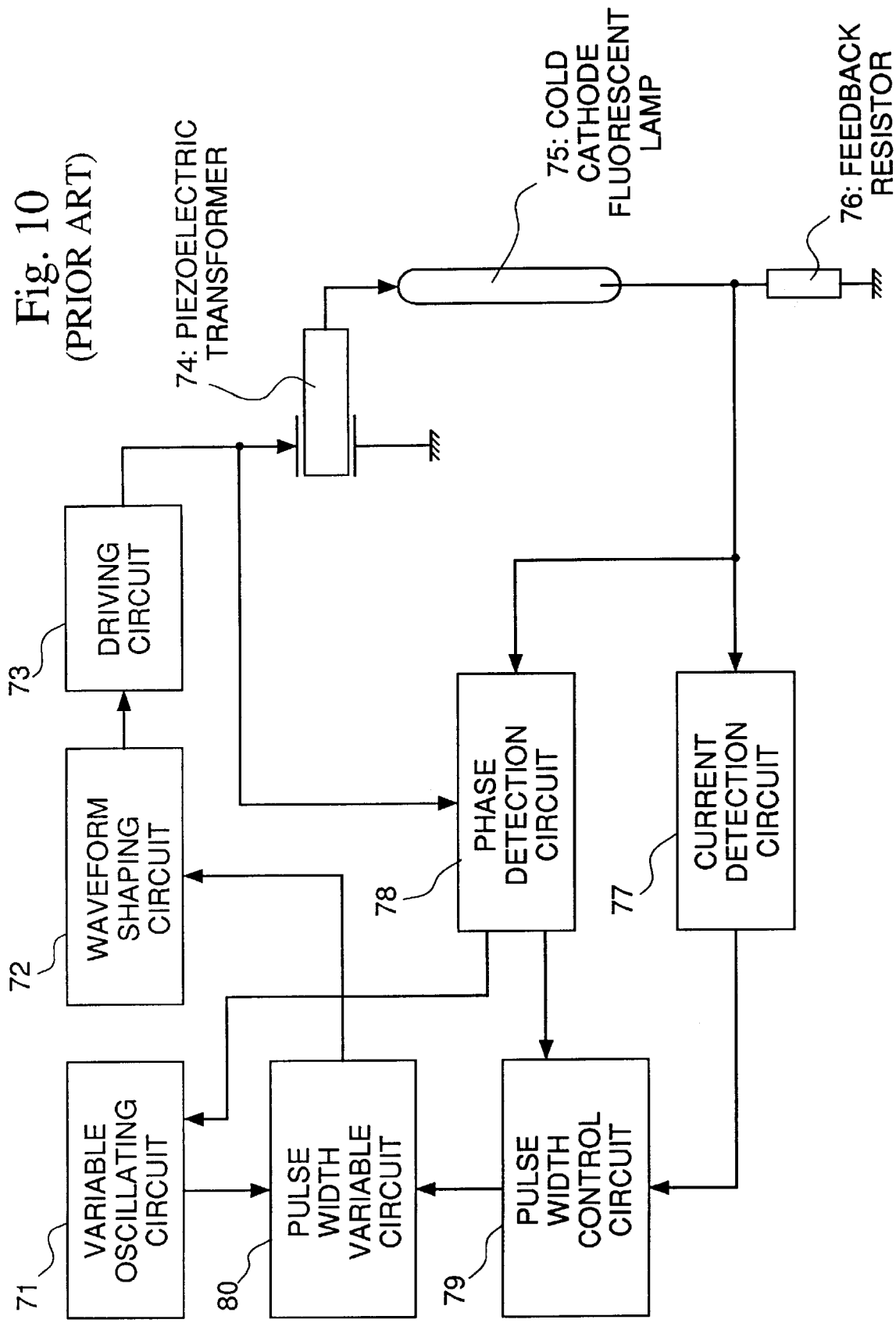
FIG. 10 is a block diagram showing an example of conventional circuits.

The fourth embodiment of the present invention is described hereinafter. FIG. 9 shows a schematic circuit diagram of the driving apparatus of the piezoelectric transformer according to the fourth embodiment of the present invention. In this figure, the same components as those in FIGS. 5 and 6 are represented by the same reference numerals and explanations of those components are omitted. The fourth embodiment is characterized in the apparatus of this embodiment is a combination of the second embodiment shown in FIG. 5 and the third embodiment shown in FIG. 6.

As shown in FIG. 11, a thermistor 45 is physically adhered to both switching transistors 12c and 12d in the driving circuit 12. One end 45a of the thermistor 45 is connected to the first input terminal 20a of the hysteresis comparator 20 as well as an optional power source, and another end 45b is grounded through a constant current source 46. The second input terminal 20b of the hysteresis comparator 20 is connected with a standard voltage source 23 for generating the standard voltage Vrefc. The output terminal 20d of the hysteresis comparator 20 is connected with a source control circuit 21. The source control circuit 21 is connected with an oscillator 42, and the output of the source control circuit 21 is connected with a control terminal 41a of the step-down DC-DC converter 41 as well as the third input terminal 20c of the hysteresis comparator 20.

The operation of this embodiment is described hereinafter. An AC voltage detected by the detection resistor 16 is subjected to the rectifier smoothing processing by the output voltage detection circuit 17 and is input into the control signal generator 18. The detected voltage, after being subjected to the rectifier smoothing processing, is compared with a predetermined standard voltage. If the detected voltage is lower than the standard voltage, the control signal generator 18 decreases the frequency control current 18b (Iosc). If the detected voltage is higher than the standard voltage, the output frequency control current 18b (Iosc) is increased. The variable range of the frequency control current 18b (Iosc) is limited within a predetermined range.

The current control oscillator 19 has a prescribed standard frequency, and is capable of oscillating at any frequency 19a (Fosc) within a limited range by the frequency control current 18b (Iosc) and the oscillating frequency being higher than the standard frequency. When the frequency control current 18b (Iosc) is low, the current control oscillator 19 reduces the oscillating frequency 19a, and when the frequency control current 18b (Iosc) is high, the current control oscillator 19 increases the oscillating frequency 19a (Fosc).

The oscillating frequency 19a (Fosc) is, similar to the first and second embodiments, divided into two half signals with the phases opposite to each other by the frequency dividing circuit 24, and subsequently, two signals are applied to the control terminals of two switching transistors 12c and 12d to control the switching operation.

The driving circuit 12 of this embodiment is the same as that of the first and third embodiments. A sine wave formed by combining two half sine waves is input at both ends of the input portion 13a of the piezoelectric transformer as a driving signal. The reciprocal of a cycle of the sine wave is the driving frequency of the piezoelectric transformer. The boosting ratio of the piezoelectric transformer has a frequency characteristic shown in FIG. 3A, and the boosting ratio changes with increasing driving frequency along the convex curve. The frequency characteristics of the piezoelectric transformer 13 is determined by the fixed impedance circuit 15 having a resistance from several tens of KΩ to several MΩ.

In order to control the detected voltage at a fixed value, the driving frequency of the driving circuit 12 is feedback controlled by a frequency control current 18b (Iosc). The boosting ratio of the piezoelectric transformer is determined by this operation. At the output portion 13b of the piezoelectric transformer, a sine wave having an amplitude of the boosting ratio multiple times larger than that of the driving wave is generated. The sine wave generated at the input portion 13b is supplied to the load as a high DC voltage.

In this embodiment, a combination of two methods is also used for changing the source DC voltage applied to the load 26, or for changing the source voltage at the time of the fixed output. One of two methods is to control the boosting ratio of the piezoelectric transformer, and another is to control the waveform of the driving wave. As explained with reference to FIG. 3B, when the piezoelectric transformer 13 is driven using a frequency range higher than the resonance point, any boosting ratio is possible depending upon the driving frequency. Accordingly, it is possible to change the high DC voltage by changing the driving frequency.

In order to change the driving frequency, it is possible to change frequency control current 18b, and to control the boosting ratio within a range of oscillating frequencies of the current control oscillator 19 by changing the resistance of the detection resistor 16. However, if the driving frequency is changed in a wide range for controlling the boosting ratio, it is necessary to use this together with a method to control the driving waveform, because, as the driving frequency shifts from the optimum frequency, switching elements 12c and 12d of the driving circuit 12 may cause a problem by generating heat.

FIGS. 3C and 4 are diagrams for explaining the problems. When the driving frequency reaches a natural frequency determined by the vibration mode, the element structure, the element size, and method of driving the piezoelectric transformer, the driving waveform is not in the state of the zero voltage switching (FIG. 4, ②). Thereby, an over current flows in switching elements 12c and 12d in the driving circuit and generates heat. Thus, it is necessary to change the driving frequency by controlling the amplitude of the driving waveform without changing the driving frequency to avoid the driving at the natural frequency.

In order to detect the natural frequency which causes problems, the generated heat of the driving circuit 12 is detected as a thermistor voltage generated by a thermister physically adhered to switching transistors 12c and 12d of the driving circuit. The thermistor voltage Vth is set in the hysteresis comparator 20 as a first threshold voltage and as a standard voltage Vrefc of the standard voltage source 23. A second threshold value is also set at a voltage which is lower than the first threshold voltage.

When the thermister voltage Vth is the same as the standard voltage Vrefc, and when the output duty-ratio of the source control circuit 21 is 100%, the hysteresis comparator 20 outputs a high level signal. When the low level signal is output from the hysteresis comparator 20, the source control circuit 21 outputs a signal with a period which is the reciprocal of the oscillating frequency 19a (Fosc) and with a duty ratio of 50% to the control terminal 41d of the step-down DC-DC converter 41 to execute an on/off operation at a frequency determined by the oscillator 42 at the duty ratio of 50%.

When the thermister voltage Vth is the same as the second threshold voltage, and when the duty-ratio of the source control circuit 21 is 50%, the hysteresis comparator 20 outputs a low level signal. When the low level signal is inputted from the hysteresis comparator 20, the source control circuit 21 output a signal of the duty-ratio of 100% to control the switching element at the normally on condition.

The relationship between the output duty-ratio of the source control circuit 21 and the thermistor voltage Vth according to this embodiment is shown in FIG. 11. As shown in the figure, when the source voltage is fixed, the output voltage of switching from the pulse width control to the non-control is higher than that of switching from the non-control to the pulse width control. When the output voltage is fixed, a hysteresis is provided that the source voltage of switching from the pulse width control to the non-control is lower than that of switching from the non-control to the pulse width control.

When the switching element is in the normally on condition, the power from the power source (DC) is wholly supplied to the driving circuit 12, the input voltage waveform is a DC voltage as shown in FIG. 2A, and when this input voltage is supplied to the driving circuit 12, a sine wave is generated at both ends of the input portion 13a of the piezoelectric transformer 13 to drive the piezoelectric transformer 13.

When the switching elements 41d conducts an on/off operation at a frequency determined by the oscillator 42 and at the duty-ratio of 50%, a DC voltage depressed into a half is output from the output terminal 41c of the step down DC-DC converter 41 and the DC voltage is input into the driving circuit. The input voltage waveform input to the driving circuit is a DC voltage, and the voltage is reduced to a half.

When this input voltage is supplied to the driving circuit, a roughly sine wave is generated at both ends of the input portion 13a of the piezoelectric transformer 13 to drive this transformer. By the use of the step-down DC-DC converter 41, the driving waveform of the piezoelectric transformer 13 has a smaller amplitude as shown in FIG. 2B than that of the driving waveform during a normally on operation shown in FIG. 2F.

As shown, when the source voltage is fixed, the output signal of the source control circuit 21 is outputted at the duty-ratio of 100% until the driving frequency reaches the natural frequency which causes problems. The driving frequency is raised by changing the resistance of the detection resistor 21 and the boosting ratio is reduced as well. When the driving frequency reaches the specified frequency, then the duty-ratio is switched from 100% to 50%, in order to reduce the driving frequency without changing the output signal and to reduce the supply of power and to reduce the amplitude of the driving waveform. While maintaining a small amplitude small, the resistance of the detection resistor 16 is varied to raise the driving frequency again, then the minimum output voltage VOmin is obtained at a driving frequency which causes the problem.

When the output voltage is fixed, the driving frequency is raised until the frequency which causes problems are encountered by raising the source voltage while maintaining the duty-ratio of the output signal of the source control circuit 21. When the driving frequency reaches the frequency of the problem, the duty-ratio of the output signal of the source control circuit is changed to 50% to reduce the amplitude of the driving frequency. The maximum source voltage VImax is obtained by increasing the source voltage until the driving frequency reaches the frequency of the problem while the amplitude is small.

The frequency of the problem is detected by a thermistor voltage generated by a thermister physically adhered to two switching transistors 12c and 12d in the driving circuit 12. The amplitude of the driving frequency is controlled by thresholding the thermistor voltage. Instability in the driving frequency can be avoided by providing a hysteresis for the threshold values.

In this embodiment, as shown in FIG. 6A, the range of the applicable output voltage is extended by a value of Δ VOmin and the range of applicable source voltage is extended by Δ VImax, as shown in FIG. 6B. As hereinabove described, the present invention provides a control method of the piezoelectric transformer capable of outputting variable voltage with a wider output range. The reason is that this method uses a combination of two methods, one of which is a first method of changing the boosting ratio by moving the driving frequency of the piezoelectric transformer, and another one of which is a second method of changing the driving waveform of the piezoelectric transformer, and the second method is particularly used when the driving frequency reaches the natural frequency of the piezoelectric transformer.

Moreover, according to the present invention, threshold values to switch those two methods are provided with the hysteresis which is effective in avoiding instability in the driving frequency at the time of switching and in avoiding to drive the piezoelectric transformer at its natural frequency. That is, when the source voltage is fixed, the output voltage at the time of switching from the pulse width control to the non-control is set higher than the output voltage at the time of switching from the non-control to the pulse width control. When the source voltage is fixed, the driving frequency is increased by changing the resistance of the detection resistor until the driving frequency reaches the natural frequency, and the boosting ratio is changed from that at the maximum output voltage. When the natural frequency is reached, the amplitude of the driving wave is reduced into a small amplitude in order to reduce the driving frequency without changing the output voltage. At this state with a small amplitude, the driving frequency is moved to the natural frequency and the minimum output voltage is obtained. Any output voltage can be obtained within a range from the maximum output voltage to the minimum output voltage.

The conventional control apparatus provides a minimum output voltage which was obtained as the output voltage driving at the natural frequency. However, the present invention extends the minimum output voltage which corresponds to the output voltage of driving at the natural frequency with smaller amplitude than the proper amplitude. The natural frequency can be detected by the use of the voltage conversion of the natural frequency or by the use of the voltage obtained by the thermistor, which facilitates setting the threshold values.

The present method and apparatus are also capable of extending the upper limit of the output source voltage. The reason is because the present invention uses a combination of two methods together for varying the output of the piezoelectric transformer consisting of a method of changing the boosting ratio by changing the driving frequency and a method of changing the driving waveform. Particularly, the method of changing the waveform is used at the natural frequency.

What is claimed is:

1. A driving method of a piezoelectric transformer, comprising steps of:
   controlling the piezoelectric transformer by switching an amplitude of the driving waveform into a small amplitude and driving said piezoelectric transformer at a driving frequency less than a natural frequency, when the driving frequency reaches a natural frequency at which the driving waveform becomes a non-zero voltage switching state or becomes a waveform superimposed with higher harmonic wave, while the driving waveform is increased within a frequency range which is higher than the resonance frequency;
   controlling the piezoelectric transformer by switching the amplitude of the driving waveform into a large amplitude and driving the piezoelectric transformer at a driving frequency higher than the natural frequency when the driving frequency reaches a predetermined frequency near the resonance frequency, while driving the piezoelectric transformer at the small amplitude and driving the piezoelectric transformer at higher frequency than the resonance frequency;
   wherein, when the source voltage is fixed, the output voltage at the time of switching the amplitude of the driving wave into the small amplitude is lower than the output voltage at the time of switching the amplitude of the waveform into the large amplitude.

2. A driving method of a piezoelectric transformer, comprising steps of:
   controlling the piezoelectric transformer by switching an amplitude of the driving waveform into a small amplitude and driving said piezoelectric transformer at a driving frequency less than a natural frequency, when the driving frequency reaches the proper driving frequency at which the driving waveform becomes a non-zero voltage switching state or becomes a waveform superimposed with higher harmonic wave, while the driving waveform is increased within a frequency range which is higher than the resonance frequency;
   controlling the piezoelectric transformer by switching the amplitude of the driving waveform into a large amplitude and driving the piezoelectric transformer at an driving frequency higher than the proper driving frequency when the driving frequency reaches a predetermined frequency near the resonance frequency, while driving the piezoelectric transformer at the small amplitude and driving the piezoelectric transformer at higher frequency than the resonance frequency;
   wherein, when the output voltage is fixed, the source voltage at the time of switching the amplitude of the driving wave into the small amplitude is higher than the source voltage at the time of switching the amplitude of the waveform into the large amplitude.

3. A driving apparatus of a piezoelectric transformer comprises:
   a driving circuit for applying the driving waveform similar to a sine wave to the input portion of the piezoelectric transformer;
   a switching element connected with both input terminals of the piezoelectric transformer and a DC power source;
   a rectifying smoothing circuit for rectifying and smoothing the output signal from the piezoelectric transformer and for applying thereof to the load;
   a fixed impedance circuit, one end of which is connected to the output terminal of the piezoelectric transformer;
   a detection resistor connected to the other end of the fixed impedance circuit;
   a output voltage detection circuit for detecting voltage at both ends of the detection resistor;
   a control signal generator for generating a control voltage and a control current in response to the detected voltage detected by the output voltage detection circuit;
   a current control oscillator which oscillates at a frequency corresponding to the control current;
   a drive control signal generating means for receiving an oscillating signal, for generating a drive control waveform to supply to the driving circuit, and for generating a driving waveform;
   a control circuit for generating a signal for controlling a switching element at an duty ratio of the signal generated by receiving the oscillating signal from the current control signal;
   a hysteresis comparison means for comparing a standard voltage which is converted from the natural frequency at which the driving waveform turns to a zero voltage switching waveform or turns to a waveform superimposed with higher harmonic waves with the output signal of said control circuit, and for converting a duty-ratio of the output signal of the control circuit into a predetermined value of 100% or less than 100% based on the result of the comparison.

4. An apparatus for driving a piezoelectric transformer according to claim 3, wherein said switching element is provided in the step-down DC-DC converter.

5. An apparatus for driving the piezoelectric transformer comprises:

a driving circuit which has a boosting type voltage resonance circuit including an input portion of the piezoelectric transformer and which inputs a driving wave which is similar to a sine wave to the input portion of the piezoelectric transformer;

a switching element connected in between the input terminal of said driving circuit and a DC power source;

a rectifying smoothing circuit for rectifying and smoothing the output signal from the piezoelectric transformer and for application thereof to the load;

a fixed impedance circuit one end of which is connected to the output terminal of said piezoelectric transformer;

a detection resistor connected to the other end of the fixed impedance circuit;

an output voltage detection circuit for detecting voltage at both ends of the detection resistor;

a control signal generator for generating a control voltage and a control current in response to the detected voltage detected by the output voltage detection circuit;

a current control oscillator which oscillates at a frequency corresponding to the control current;

a drive control signal generating means for receiving an oscillating signal, for generating a drive control waveform to supply to the driving circuit, and for generating a driving waveform;

a temperature detecting element physically attached to said switching transistors in the driving circuit;

a control circuit for generating a signal for controlling a switching element at a duty ratio of the signal generated by receiving the oscillating signal from the current control signal;

a hysteresis comparison means for comparing a standard voltage which is converted from the natural frequency at which the driving waveform turns into a zero voltage switching waveform or turns into a waveform superimposed with higher harmonic waves with the output signal of said control circuit, and for converting a duty-ratio of the output signal of the control circuit into a predetermined value of 100% or less than 100% based on the result of the comparison.

6. An apparatus for driving a piezoelectric transformer according to claim 5, wherein said switching element is that provided in a step-down type DC-DC converter.

7. An apparatus for driving a piezoelectric transformer according to claim 3, wherein said driving circuit comprises first and second switching transistors whose sources are grounded, respectively; first coil, one end of which is connected with a source supply terminal and another end of which is connected with the drain of said first switching transistor and with one end of the input portion of the piezoelectric transformer; and a second coil one end of which is connected with the power supply terminal and another end of which is connected with the drain of said second switching transistor and with the other end of the input portion of the piezoelectric transformer; and said driving control signal generating means comprises a frequency dividing circuit for outputting the first and second divided signals which have opposite phases from each other by frequency-dividing the oscillating signal output from said current control oscillator; and a buffer circuit for temporally storing said divided signals and applying said divided signals to the gates of said first and second switching transistors for switching said first and second transistors alternately.

8. An apparatus for driving the piezoelectric transformer according to claim 3, wherein said hysteresis comparison means comprises:

a standard voltage source for outputting a standard voltage which is set, as a first threshold voltage, at a lower voltage among two voltages, one of which is converted from the driving frequency at which the driving frequency of the piezoelectric transformer is turned into the non-zero voltage switching waveform and another of which is converted from the driving frequency which is turned into a waveform with superimposed high harmonic frequencies; and a hysteresis comparator for comparing said control voltage from said control signal generator with said first threshold voltage and the output signal of said control circuit, and outputting a signal having the first logic value to switch the duty-ratio of the output signal of said control circuit into a predetermined value of less than 100%, when said control signal reaches said first threshold value while operating when the duty-ratio of the output signal of said control circuit is 100%; and outputting a signal having the second logic value to switch the duty-ratio of the output signal of said control circuit into 100% when said control signal reaches a second threshold value which is lower than said first threshold value and higher than a voltage converted from the resonance frequency, while operating when the duty-ratio of the output signal of said control circuit is the predetermined value of less than 100%.

9. An apparatus for driving the piezoelectric transformer according to claim 5, wherein said hysteresis comparison means comprises:

a standard voltage source for outputting a standard voltage which is set, as a first threshold voltage, at a lower voltage among two voltages, one of which is converted from the driving frequency at which the driving frequency of the piezoelectric transformer is turned to the non-zero voltage switching waveform and another of which is converted from the driving frequency which is turned to be a waveform with superimposed high harmonic frequencies; and a hysteresis comparator for comparing the temperature detected voltage from said temperature detection element, said first threshold voltage from said standard voltage source, and the output signal from said control circuit, and outputting a signal having the first logic value to switch the duty-ratio of the output signal of said control circuit into a predetermined value of less than 100%, when said control signal reaches said first threshold value while operating when the duty-ratio of the output signal of said control circuit is 100%; and outputting a signal having the second logic value to switch the duty-ratio of the output signal of said control circuit into 100% when said control signal reaches a second threshold value which is lower than said first threshold value and higher than a voltage converted from the resonance frequency, while operating when the duty-ratio of the output signal of said control circuit is the predetermined value of less than 100%.

\* \* \* \* \*